United States Patent [19]
Sakai et al.

[11] Patent Number: 5,118,973
[45] Date of Patent: Jun. 2, 1992

[54] EMITTER COUPLED LOGIC CIRCUIT HAVING INDEPENDENT INPUT TRANSISTORS

[75] Inventors: Toshiaki Sakai, Kawasaki; Taichi Saitoh, Yokohama, both of Japan

[73] Assignee: Fujitsu Limited, Kawasaki, Japan

[21] Appl. No.: 570,857

[22] Filed: Aug. 22, 1990

[30] Foreign Application Priority Data

Aug. 25, 1989 [JP] Japan .................................. 1-219133
Jan. 12, 1990 [JP] Japan ...................................... 2-5331

[51] Int. Cl.$^5$ ..................... H03K 19/092; H03K 17/16
[52] U.S. Cl. .................................... 307/455; 307/456; 307/242; 307/246; 307/270
[58] Field of Search ................. 307/446, 443, 454–456, 307/242, 246, 270

[56] References Cited

U.S. PATENT DOCUMENTS 4,680,480 7/1987 Hopta ..................... 307/270
4,906,869 3/1990 Masuoka .............. 307/455

FOREIGN PATENT DOCUMENTS 0293833 12/1988 European Pat. Off. .

OTHER PUBLICATIONS

Patent Abstracts of Japan, vol. 13, No. 343 (E-796) [3691], Aug. 2, 1989 & JP-A-1 101 022 (Hitachi Ltd.) Apr. 19, 1989.
Patent Abstracts of Japan, vol. 8, No. 221 (E-271) [1658], Oct. 9, 1984; & JP-A-59 105 719 (Fujitsu K.K.).
Patent Abstracts of Japan, vol.14, No. 348 (E-957) [4291], Jul. 27, 1990; & JP-A-2 121 409 (Hitachi Ltd.) May 9, 1990.
Soviet Inventions Illustrated, Section U21, Week 8928, Aug. 23, 1989, Class U21-CIA, Accession No. 89-205294/28, Derwent Publications Ltd., London, GB; & SU-1-141 850 (TAWI).

*Primary Examiner*—John S. Heyman
*Assistant Examiner*—Margaret Rose Wambach
*Attorney, Agent, or Firm*—Staas & Halsey

[57] ABSTRACT

An improved emitter coupled logic circuit suitable for high speed logic operation independent of capacitive load. With previous circuits as the load to be driven become heavier, the capacitive load required a longer time for discharge and the output signal was dulled, resulting in adverse effect on the logic operation when the output changed to a low level from a high level. A pulse has also been previously applied to a pull-down transistor connected between the output and a power source through a capacitor from an inverted phase output to actively discharge the capacitive load. However, when the capacitor is connected to the output it hinders the switching speed of a current switch. In the present invention, a transistor is provided an input circuit and a pulse is applied to a pull-down transistor from the transistor. As a result, an extra capacitive element is not connected to the output end, but a pulse is applied to the pull-down transistor. Accordingly, even if the capacitive load becomes heavier, the speed of the circuit is not harmed.

28 Claims, 23 Drawing Sheets

EMITTER COUPLED LOGIC CIRCUIT HAVING INDEPENDENT INPUT TRANSISTORS

BACKGROUND OF THE INVENTION a. Field of the Invention

The present invention relates to an emitter coupled logic (ECL) circuit, and more particularly, to an emitter coupled logic circuit having an improved active pull-down circuit.

b. Description of the Related Art

Conventional ECL circuits are well known in the art. FIG. 1 is a schematic diagram illustrating a conventional ECL circuit. The conventional circuit consists of a current switch circuit having transistors Q1, Q2, Q3 and resistors R1, R2, R3 and an emitter follower circuit having transistor Q4 and pull-down resistor R4. Further, 1 and 2 denote input terminals, 3 denotes an output terminal, and 4 denotes a threshold voltage terminal. The conventional ECL circuit illustrated in FIG. 1 is a 2-input NOR gate. A constant current power source may be used in place of the resistor R3.

The operation of the conventional ECL circuit illustrated in FIG. 1 and the problems associated therewith are discussed below.

When collector voltages of transistors Q1 and Q2 change to a logical high level from a logical low level, transistor Q4 of the emitter follower circuit becomes conductive charging a capacitive load CL connected to the output terminal 3. In this case, because the emitter impedance of transistor Q4 is sufficiently low, the capacitive load CL is quickly charged up.

On the other hand, when one of the collector voltages of transistors Q1, Q2 of the current switch circuit changes to a low level from a high level, the capacitive load CL discharges through pull-down resistor R4 which is connected in series with the emitter of transistor Q4. In this case, when pull-down resistor R4 has a sufficiently small resistance value, the capacitive load CL can be quickly discharged. However, when pull-down resistor R4 is sufficiently small in resistance value, a large current flows continuously into the transistor Q4 which increases power dissipation. As a result, in the case of a large scale integrated circuit (LSI) with a high packing density, although a small resistance value is desired, to obtain a low power dissipation a pull-down resistance value which is too small cannot be selected. Thus, the discharge time of the capacitive load CL is slower than desired. This problem becomes more troublesome as the capacitive load CL increases.

This problem also results if a constant current source is used in place of pull-down resistor R4 to discharge the capacitive load CL. When a current level of the current source is high, the capacitive load CL can be quickly discharged. However, as the current level increases so does power dissipation. Accordingly, a high current level cannot be used because it would result in large power dissipation which is unsuitable for high density LSIs.

Therefore, when the capacitive load CL is large, a transient time for changing the output to a low level from a high level becomes longer than that for changing the output to a high level from a low level. As a result, the transient times for changing to a low level from a high level and for changing to a high level from a low level are unbalanced. These unbalanced transient times result in problems in design, namely timing, logical structures and actual operation.

An active pull-down type ECL circuit has previously been proposed to solve this dilemma. Such a circuit discharges the capacitive load CL into a low impedance when the output changes to a low level from a high level in place of the pull-down resistor R4 or constant current source. FIG. 2 is a schematic diagram of an active pull-down type ECL circuit associated with the prior art. The circuit consists of transistors Q11-Q17, resistors R11-R15, and capacitors C11, C12. A DC bias voltage is applied to the base of pull-down transistor Q17 to operate it as a constant current source with a circuit consisting of transistors Q14, Q15 and resistor R14 so that a low current flows continuously. This structure is used because transistors which are in the OFF state require a longer time to turn ON.

The active pull-down ECL circuit illustrated in FIG. 2 has a NOR phase output and operates as follows. A pulse (having the waveform obtained by electrically differentiating an inverted phase signal of the signal applied to the base of emitter follower transistor Q16 with capacitor C11 and resistor R14) is applied to the base of pull-down transistor Q17 from the collector of the transistor Q12 of the inverted phase side of the current switch circuit. When an input changes to the high level from the low level, the pulse is generated. The pulse is applied to the base of pull-down transistor Q17 to transitionally turn it ON to discharge the capacitive load CL. Since the emitter impedance of transistor Q17 is sufficiently low, the capacitive load CL is quickly discharged. Further, capacitor C12 is transitionally charged through the transistor Q17 by the charge discharged from the capacitive load CL. The charge of the capacitor C12 is thereafter discharged through resistor R15.

FIG. 3 is a schematic diagram of an active pull-down ECL circuit having an OR phase output which is also associated with the prior art. This circuit consists of transistors Q21-Q27, resistors R21-R25, and capacitors C21, C22. Moreover, the circuit has the same construction and operation as the circuit illustrated in FIG. 2 except that the pulse applied to pull-down transistor Q27, is from the collector of transistor Q21 of the current switch circuit, while the base of the emitter follower transistor Q26 is connected to the collector of transistor Q22 of the current switch circuit.

FIG. 4 is a schematic diagram of an active pull-down ECL circuit having OR/NOR phase outputs which is associated with the prior art. This circuit consists of transistors Q31-Q41, resistors R31-R37, and capacitors C31-C34. The pulse applied to the base of pull-down transistor Q37 or Q41 is extracted from the inverted phase output at output terminals 35 or 34. In this case, charge is quickly discharged for high speed switching to the low level from the high level using an operation similar to that described above. However, this ECL circuit has a higher logic function capability because it allows use of the outputs in both OR/NOR phases. Thus, more complicated circuits can be equivalently formed even with the same number of gates. Thus, even in the case where an active pull-down circuit is used for further improving the operation rate of the ECL circuit, in order to increase the logic function capability of the circuit the outputs of both OR/NOR phases must be used.

FIG. 5 is a schematic diagram of an active pull-down ECL circuit having a construction similar to that of FIG. 4. This circuit consists of transistors Q51–Q61, resistors R51–R57, and capacitors C51–C54. As shown in FIG. 5, signals can be extracted from the collectors of transistors Q51, Q52 of the current switch circuit and supplied to pull-down transistors Q57, Q61. It is known that the switching rate of the current switch circuit is lowered when a capacitor C51 or C53 is connected to the collector of the transistor Q51 or Q52 of the current switch circuit. However, in the case of a single phase ECL circuit (OR or NOR), as shown in FIGS. 2 and 3, only the inverted phase signal is used for the active pull-down circuit and is not used for the base signal of emitter follower transistor. Thus, the addition of capacitor C11 or C21 to the ECL circuit will not cause the switching rate to be lowered. However, when both phases OR/NOR are used in the ECL circuit, as shown in FIG. 5, capacitor C53 and C51 are respectively connected to the collector of transistor Q51 and Q52 of the current switch circuit for extracting a signal from the base of the emitter follower transistors Q56 and Q60, respectively. Therefore, the switching rate is lowered and improvement over an ordinary ECL circuit is lost. This problem can be compensated to a limited extent by either making the value of resistor R53 smaller or raising the voltage of terminal 53 to increase the current of the current switch circuit. However, as discussed above, this increases power dissipation, thus making unsuitable for high density LSI.

Furthermore, even with the method of extracting the pulse shown in FIG. 4 from the output terminals 34 or 35 having the inverted phase, capacitors C31 and C33 are additionally connected, thereby increasing the switching time. Further, in the case where the capacitive load CL is connected to the output of the inverted phase, the output waveform is dulled and, as a result, an adequate pulse can no longer be applied to the base of pull-down transistor Q37 or Q41. In addition, since the inverted phase output signal is applied to the base of pull-down transistor Q37 or Q41 is obtained from the input terminal 31 through two stages of transistors Q32 and Q36 or Q31 and Q40, the inverted phase output takes a longer time to reach pull-down transistor Q37 or Q41 which causes the time discharge of capacitive load CL to be delayed.

Therefore, with any of the prior art methods, it is very difficult to simultaneously use a high speed active pull-down ECL circuit with the OR/NOR phases. Further, high speed operation can be maintained only by forming the ECL circuit with OR/NOR phases with individual gates and by increasing the current through the current switch circuit. However, this causes the power dissipation to become large which prevents an increase in the integration density of the LSI. As a result, these prior art methods are not suitable for use with LSI of high integration density, particularly when the capacitive load is large. Therefore, a circuit which ensures high speed switching to a low level from a high level and simultaneously uses both OR and NOR phases in a high speed LSI circuit with an active pull-down structure has long been required.

SUMMARY OF THE INVENTION

It is a general object of the present invention to provide a novel and useful high speed ECL circuit having an improved active pull-down circuit.

Another object of the present invention is to provide an ECL circuit which not only ensures high speed switching to the low level from the high level but also allows simultaneous use of OR and NOR phases even when the capacitive load is large.

The present invention relates to an ECL circuit which includes a current switch circuit having first and second transistors, of which emitters are connected in common and the base of the first transistor is connected to an input terminal; a current source connected to the common emitter; an emitter follower transistor, connected in the side of a first power source in which the base thereof is connected to at least one collector of the first and second transistors and the emitter thereof is connected to an output terminal; a pull-down transistor, connecting the collector thereof to the output terminal; an input circuit, connecting a third transistor and an impedance device in series between the power sources and also connecting the base of the third transistor to the input terminal; and a capacitor provided between the emitter of the third transistor and the base of the pull-down transistor.

DESCRIPTION OF THE PREFERRED EMBODIMENTS

Figure 6:
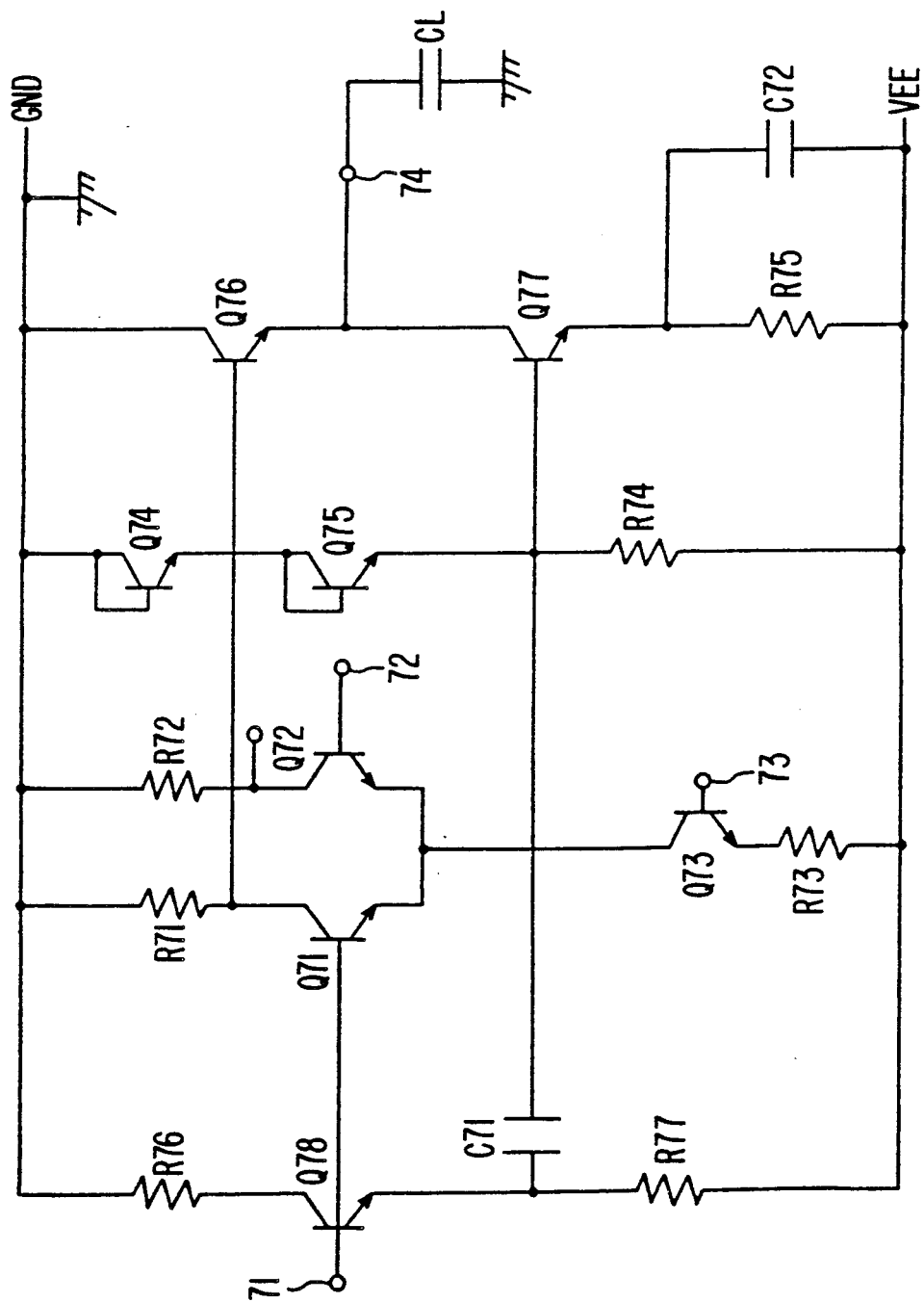
FIG. 6 is a schematic diagram of an embodiment for explaining a NOR phase output of the present invention.

FIG. 6 is a schematic diagram illustrating a first embodiment of the ECL circuit of the present invention. In FIG. 6, C71 and C72 denote capacitors, Q71 to Q78 denote NPN transistors, and R71 to R77 denote resistors. Terminal 71 is an input terminal, and terminal 74 is an output terminal. A reference voltage ($V_{ref}$) is supplied to terminal 72, while a constant voltage ($V_{cs}$), which is sufficient for turning ON transistor Q73, is supplied to terminal 73.

In this circuit, the NOR phase output is considered as the active pull-down output. Capacitor C71 is inserted between the emitter of transistor Q78 and the base of pull-down transistor Q77 to give an AC-coupled pulse to pull-down transistor Q77. The collector of transistor Q78 is connected to ground GND through resistor R76, while the emitter is connected to supply voltage $V_{EE}$ through resistor R77. The pulse to be applied to the base of pull-down transistor Q77 is extracted from the emitter of transistor Q78 through the capacitor C71 when the ECL circuit provides the NOR phase output.

When an input signal is applied to the base of transistor Q71 of the current switch circuit through input terminal 71, ordinary ECL circuit operation is carried out. Meanwhile, the input signal, which is also supplied in parallel to the input circuit consisting of transistor Q78 and resistors R76, R77, generates a signal in the inverted phase of the input signal in the collector side of transistor Q78 and also generates a signal in the same phase in the emitter side of transistor Q78.

Moreover, an adequate DC voltage is applied to the base of pull-down transistor Q77 from a DC biasing circuit consisting of the transistors Q74, Q75 and resistor R74 to apply an adequate current to pull-down transistor Q77 in order to realize quick switching operation. This portion of the circuit may be replaced with any other circuit which can apply an adequate DC voltage to the base of pull-down transistor Q77.

When the input signal changes to a high level from a low level, an emitter voltage of transistor Q78 also changes to the high level from the low level. The change in the emitter voltage generates a positive pulse having a short duration using a differential circuit consisting of capacitor C71 and resistor R74. When this positive pulse is applied to the base of pull-down transistor Q77, pull-down transistor Q77 is transitionally turned ON. As a result, the pull-down transistor Q77 quickly discharges the capacitive load CL when the NOR output from output terminal 74 of the ECL circuit changes to the low level from the high level.

Although not illustrated in FIG. 6, an output circuit corresponding to emitter follower Q76 of FIG. 6 is often provided in a stage preceding input terminal 71. In this case, however, a problem arises, namely capacitor C71 might delay operation of the output circuit. However, since an impedance observed from the output circuit of the preceding stage is formed only by transistor Q78, the operation of output circuit in the preceding stage will never be delayed due to capacitor C71. Moreover, current dissipation only increases slightly due to transistor Q78 because it is only required to generate a pulse to be applied to pull-down transistor Q77 and a large current is not required.

Figure 1:
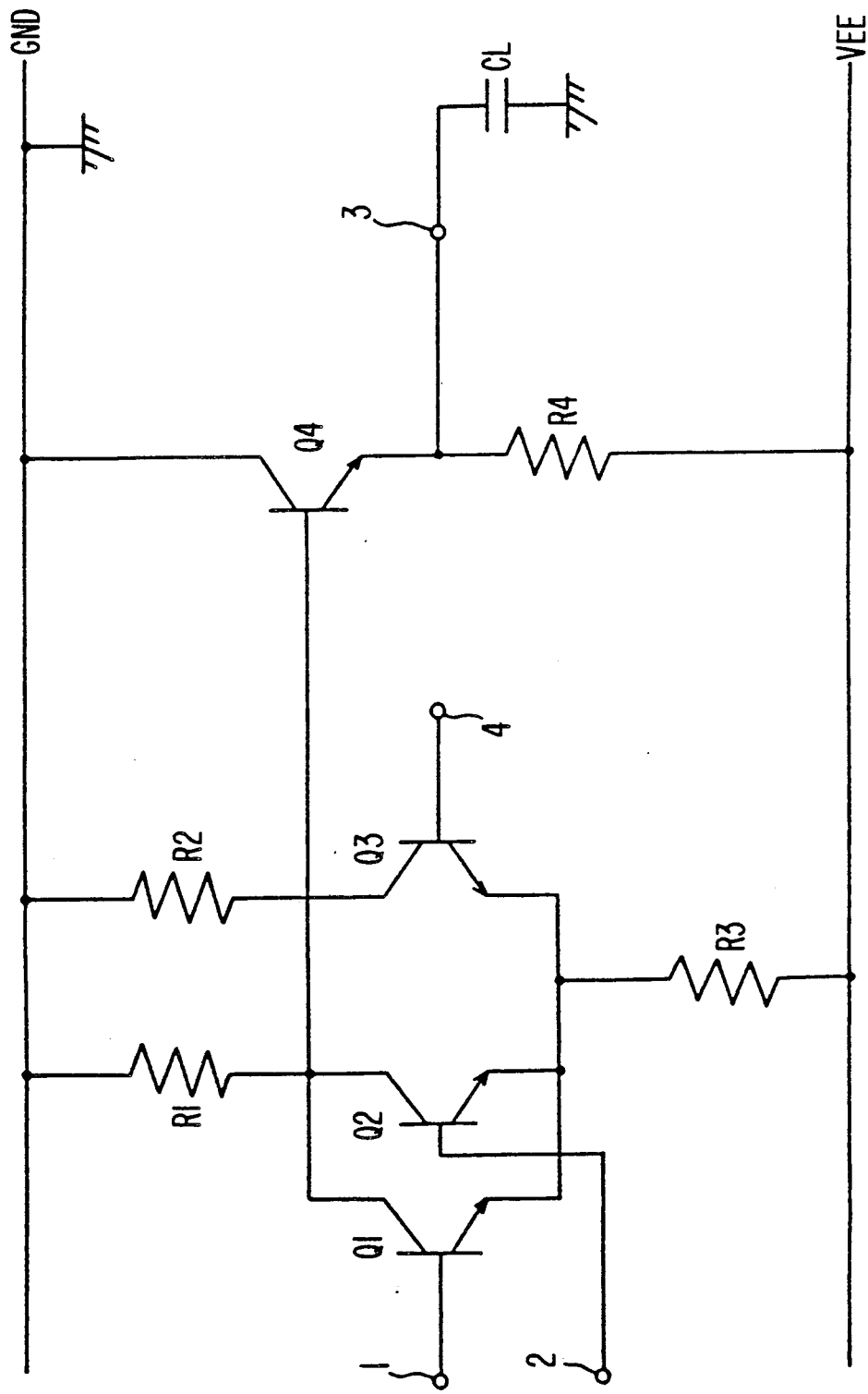
FIG. 1 is a schematic diagram of a basic ECL circuit of the prior art.
Figure 2:
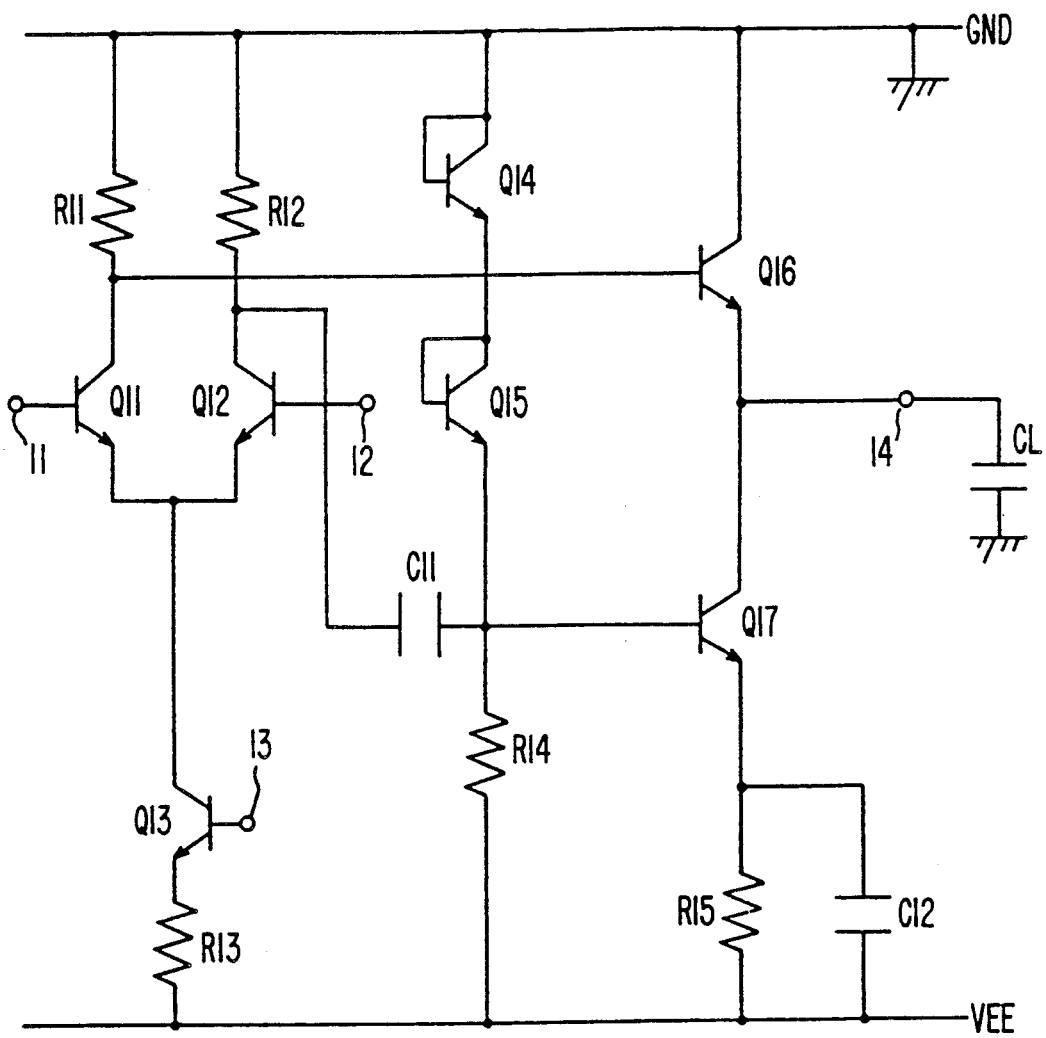
FIG. 2 is a schematic diagram of an active pull-down ECL circuit with a NOR phase output of the prior art.
Figure 3:
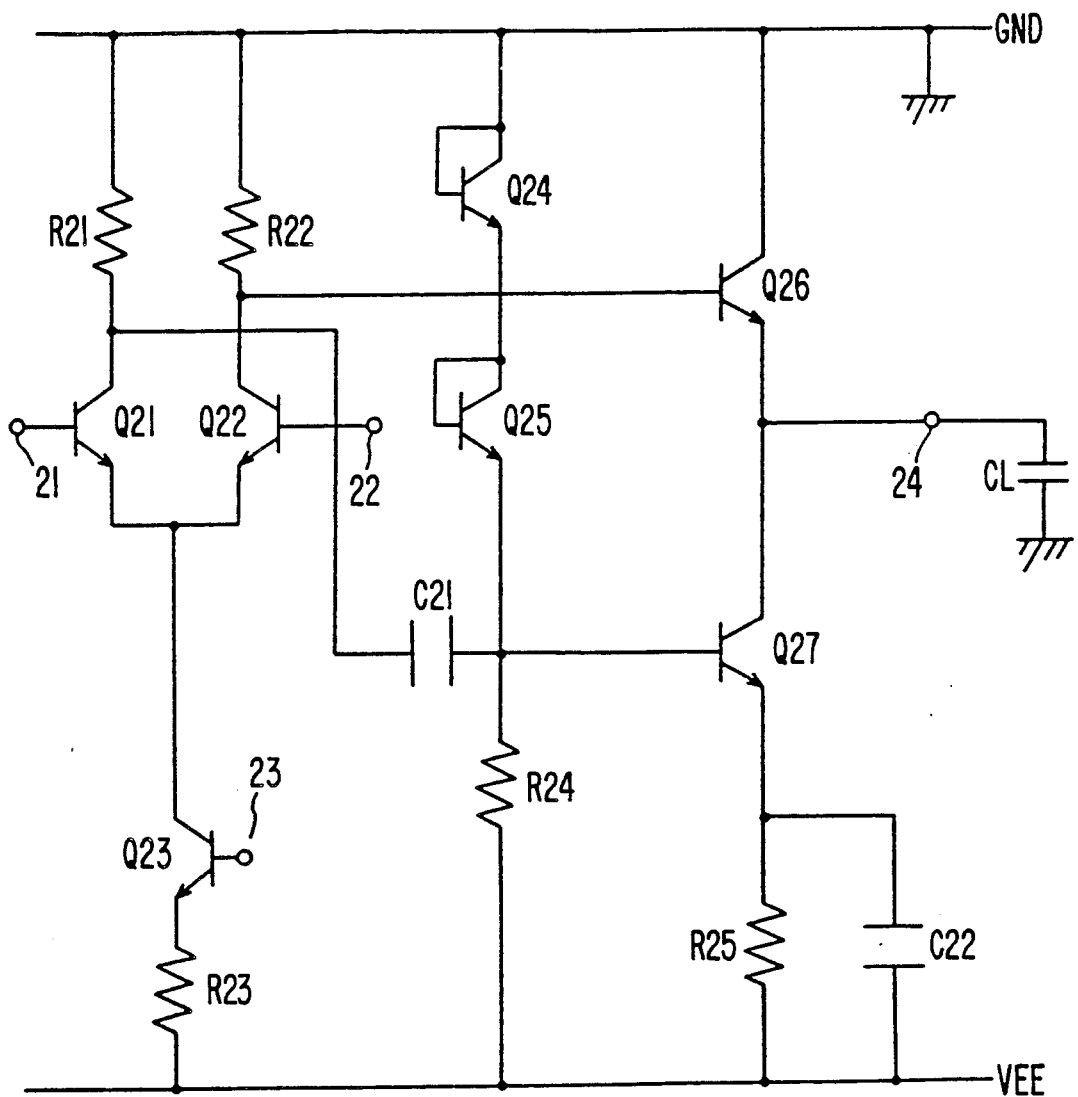
FIG. 3 is a schematic diagram of an active pull-down ECL circuit with an OR phase output of the prior art.
Figure 4:
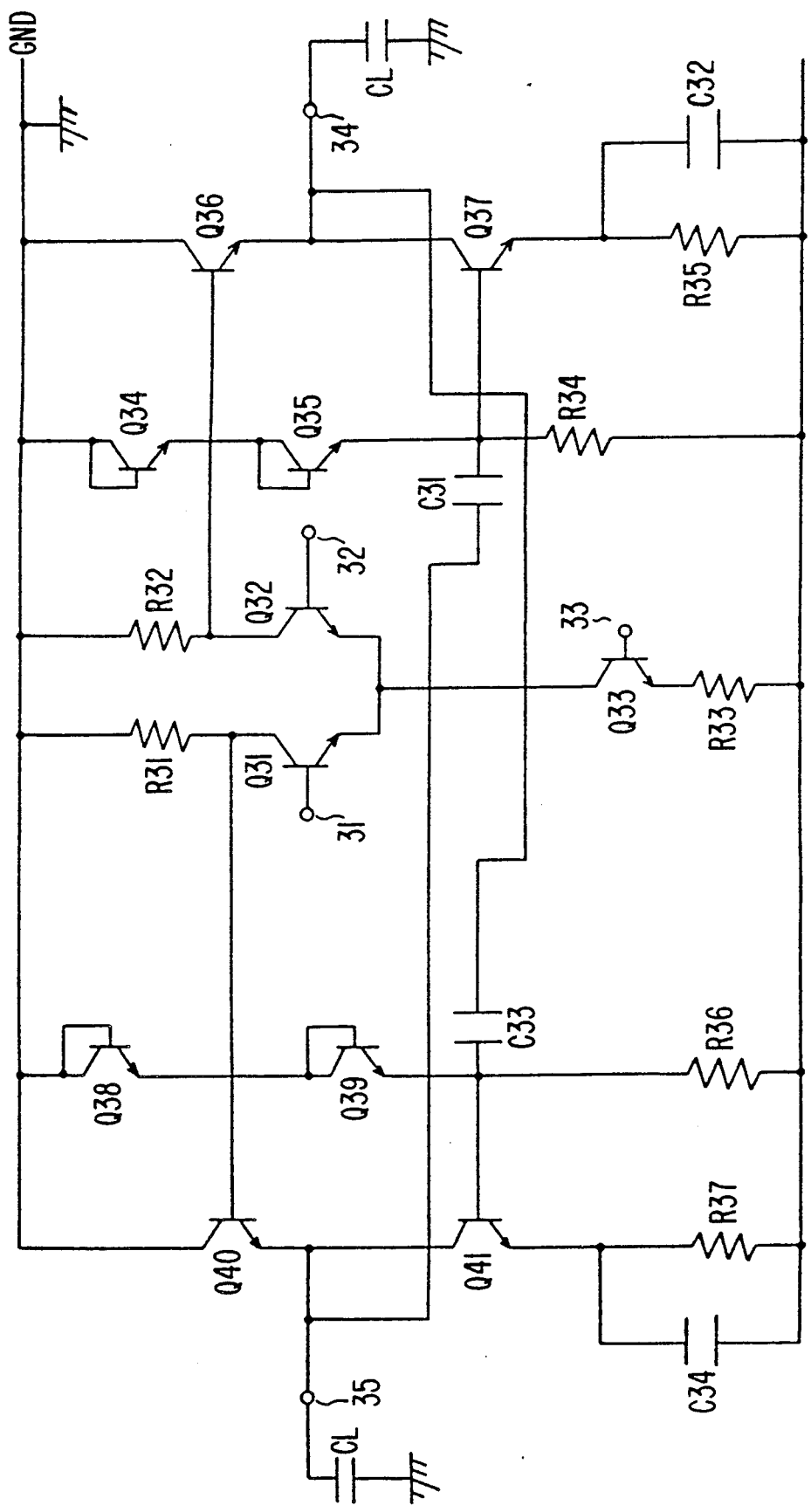
FIG. 4 is a schematic diagram of an active pull-down ECL circuit with OR/NOR phases output of the prior art.
Figure 5:
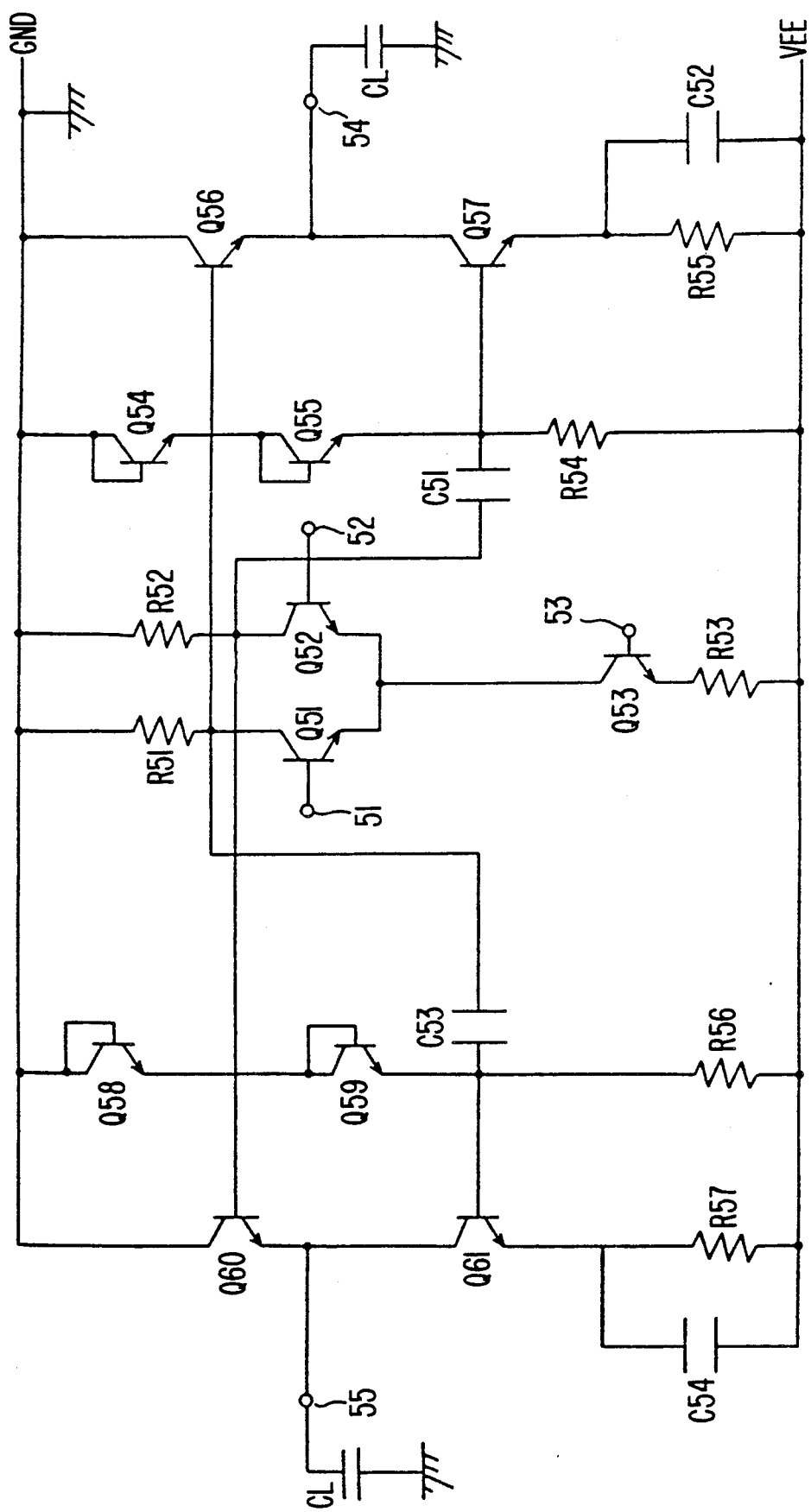
FIG. 5 is a schematic diagram of an active pull-down ECL circuit of the prior art for both OR/NOR phases which obtains a pulse for a pull-down transistor from an output from an inverted phase side.

In the circuit for extracting a signal from the collector of transistor Q12 of the conventional current switch circuit shown in FIG. 2, a pulse is generated only when an input voltage comes to a threshold voltage ($V_{ref}$) input to terminal 12 of the ECL circuit. Namely, a considerable time is required until a collector voltage of transistor Q12 changes after a signal is applied to the input terminal 11. On the other hand, in the present invention shown in FIG. 6, a pulse is quickly generated with change of input signal and therefore the base of pull-down transistor Q77 is quickly driven. Accordingly, when the signal changes to the low level from the high level, the ECL circuit of the present invention operates at a higher speed than that of the conventional circuit. In addition, the present invention is more effective for smaller capacitive loads CL.

Figure 7:
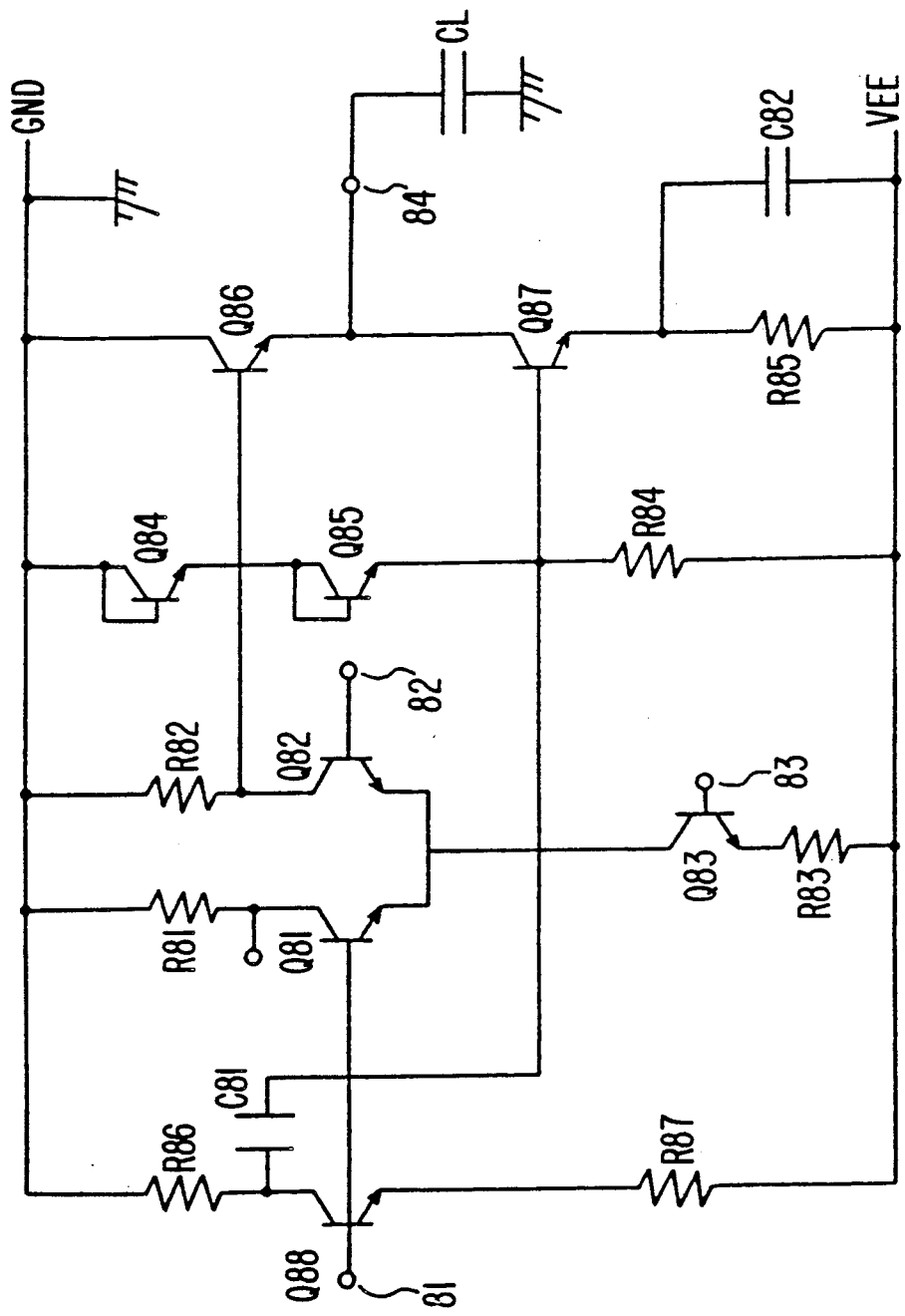
FIG. 7 is a schematic diagram of an embodiment for explaining an OR phase output of the present invention.

FIG. 7 is a schematic diagram illustrating a second embodiment of the present invention. In FIG. 7, C81 and C82 denote capacitors, Q81 to Q88 denote NPN transistors, and R81 to R87 denote resistors. Terminal 81 is an input terminal, and terminal 84 is an output terminal. A reference voltage ($V_{ref}$) of the current switch is applied to terminal 82, while a constant voltage ($V_{cs}$) sufficient for turning ON transistor Q83 is supplied to terminal 83.

In this circuit, the OR phase output is considered as the pull-down output. Capacitor C81 is inserted between the collector of transistor Q88 and the base of pull-down transistor 87 for supplying an AC coupled phase to the pull-down transistor Q87. The collector of transistor Q88 is connected to ground GND through resistor R86, while the emitter is connected to the supply voltage $V_{EE}$ through resistor 87. Hence, a pulse to be supplied to the base of pull-down transistor Q87 is extracted from the collector of transistor Q88 through a capacitor C81 when an output of ECL circuit is in the OR phase.

During operation of the circuit of the second embodiment, the collector voltage of transistor Q88 changes to the high level from the low level when an input signal changes to the low level from the high level. This change in collector voltage generates a pulse having a short duration using a differential circuit formed by capacitor C81 and resistor R84. When this pulse is applied to the base of pull-down transistor Q87, pull-down transistor Q87 transitionally turns ON to quickly discharge the capacitive load CL when the OR phase output from output terminal 84 of ECL circuit changes to the low level from the high level.

Figure 8:
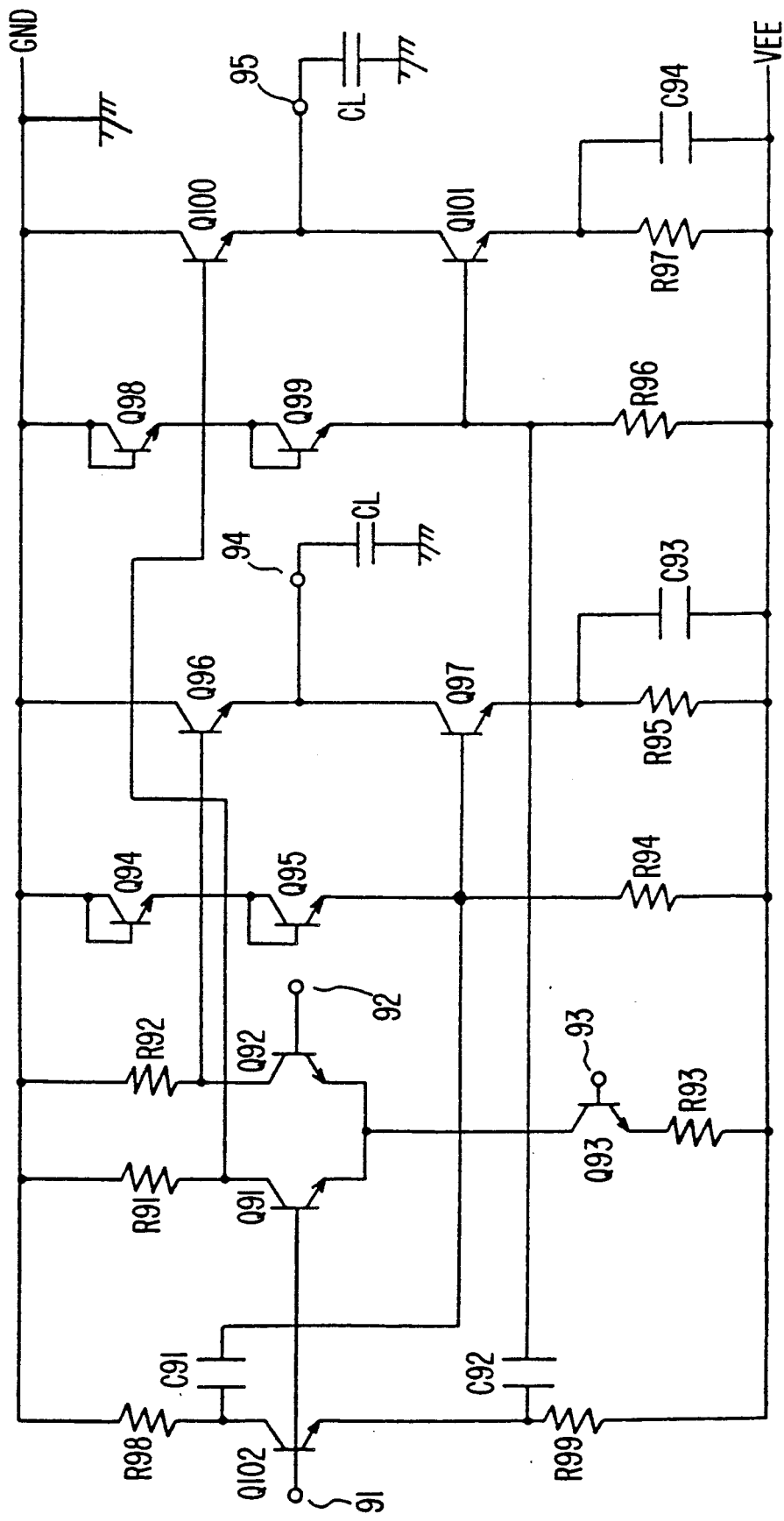
FIG. 8 is a schematic diagram of an embodiment for explaining both OR/NOR phase outputs of the present invention.

FIG. 8 is a schematic diagram illustrating a third embodiment of the present invention. In this embodiment, the ECL circuit for supplying a DC voltage to the base of the pull-down transistor is formed individually for both the OR and NOR phases. In FIG. 8, C91 to C94 are capacitors, Q91 to Q102 are NPN transistors, and R91 to R99 are resistors. Terminal 91 is an input terminal, and terminals 94, 95 are output terminals. A reference voltage ($V_{ref}$) for the current switch circuit is applied to terminal 92, while a constant voltage ($V_{cs}$) which is sufficient for turning ON the transistor Q93 to terminal 93.

In this circuit, both OR and NOR phase outputs are considered as the active pull-down outputs. Capacitor C92 is inserted between the emitter of transistor Q102 and the base of pull-down transistor Q101 to supply an AC coupled pulse to pull-down transistor Q101. The collector of transistor Q102 is connected to ground GND through resistor R98 and the emitter to the supply voltage $V_{EE}$ through resistor R99. The pulse to be applied to the base of pull-down transistor Q97 for the OR phase output is extracted from the collector of transistor Q102 through capacitor C91. On the other hand, the pulse to be applied to the base of pull-down transistor Q101 for the NOR phase output is extracted from the emitter of transistor Q102 through capacitor C92.

During operation of the third embodiment, when the input signal changes to a high level from a low level, the emitter voltage of transistor Q102 also changes to a high level from a low level. This change in the emitter voltage generates a positive pulse of short duration with a differential circuit consisting of capacitor C92 and resistor R96. Further, when the input signal changes to a low level from a high level, the collector voltage of transistor Q102 changes to a high level from a low level, thus generating a positive pulse of short duration by a differential circuit consisting of a capacitor C91 and a resistor R94. When these signals are applied to pull-down transistors Q97, Q101, pull-down transistors Q97, Q101 transitionally turn ON while the OR and NOR outputs 94 and 95 of the ECL circuit change to the low level from the high level to quickly discharge the capacitive load CL.

Figure 9:
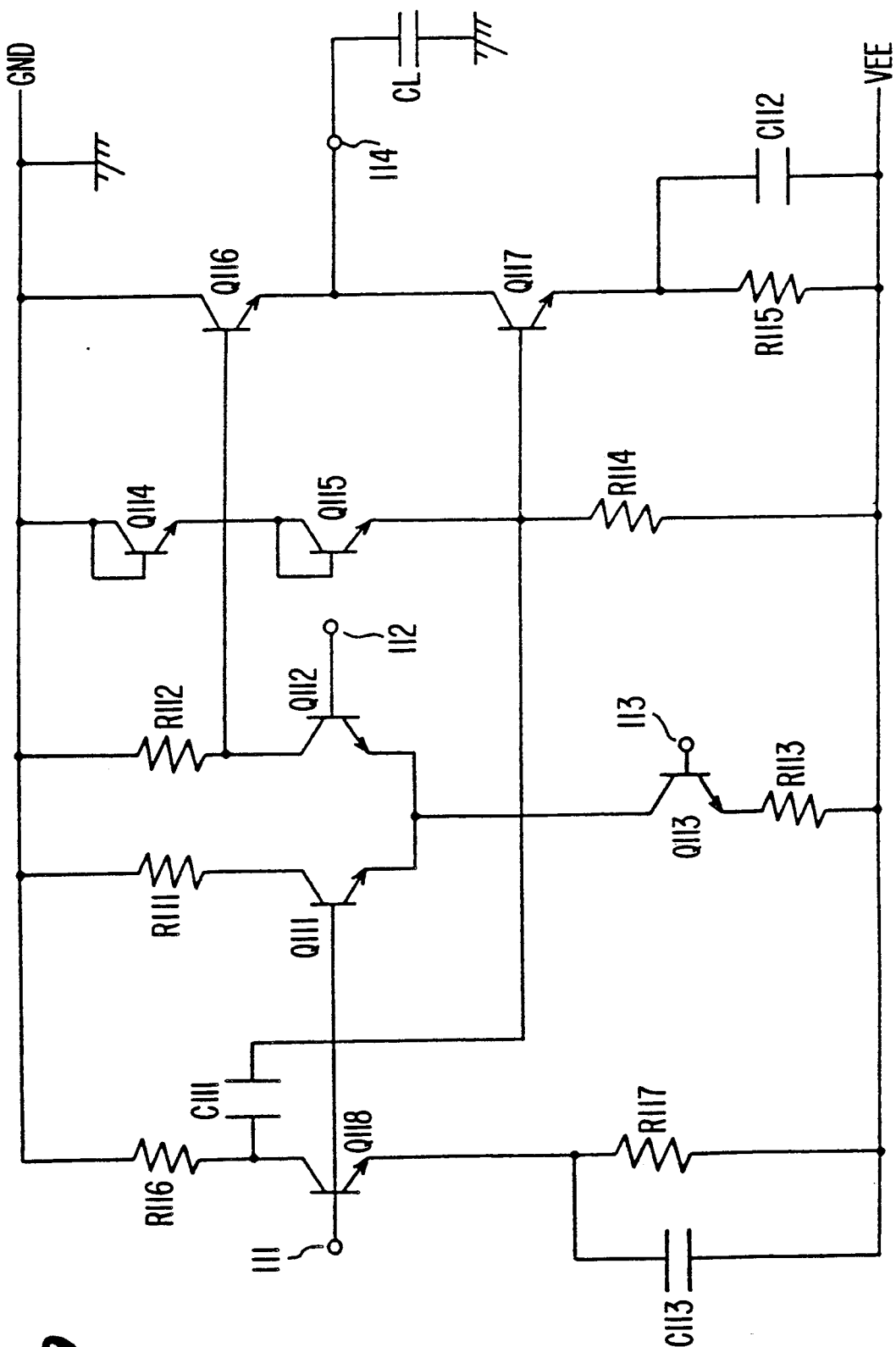
FIG. 9 is a schematic diagram of an embodiment for explaining the structure of additionally connecting speed-up capacitor in the present invention.

FIG. 9 is a schematic diagram illustrating a fourth embodiment of the present invention. In FIG. 9, C111 to C113 are capacitors, Q111 to Q118 are transistors, and R111 to R117 are resistors. Terminal 111 is an input terminal, terminal 112 is a reference voltage terminal, terminal 113 is a constant voltage terminal, and terminal 114 is an output terminal. The OR phase output is illustrated as the active pull-down output in FIG. 9. High speed operation is further realized by providing a speed-up capacitor to the input circuit as a pulse generating circuit consisting of a transistor Q118 and resistors R116, R117. Namely, a speed-up capacitor C113 is connected in parallel with resistor R117 in the emitter side of transistor Q118.

The addition of speed-up capacitor C113 lowers the AC impedance of the input circuit and a current may be applied transitionally to the capacitor C113. As a result, the pulse to be applied to the base of pull-down transistor Q117 can be generated at high speed. Accordingly, the higher the frequency of input signal is, the more distinctive the effect of capacitor C113 becomes. Note, capacitor C113 is effective only for obtaining the high speed OR phase output.

The capacitance of speed-up capacitor C113 is selected in accordance with the capacitive load CL because of the following reasons. When the capacitive load CL is small, the amplitude of undershoot (relaxing vibration when the pulse falls) generated at the output terminal 114 becomes large. In this case, when the output voltage of output terminal 114 drops to a low level from a high level, the level goes below the ordinary low level. Thereafter, excessive low level in turn rises to a level exceeding the ordinary low level. Namely, ringing of the output voltage is produced at the output terminal 114. If this ringing is generated, the output voltage level exceeds the threshold voltage ($V_{ref}$) of the input transistor of the ECL circuit connected in the next stage (not illustrated), thus resulting in malfunction.

To prevent such malfunction one can make the amplitude of the pulse to be applied to pull-down transistor Q117 small. This will cause the amplitude of undershoot to become small. For this purpose, the amplitude of the pulse generated may be set smaller by making the capacitance value of capacitor C113 small in accordance with capacitive load CL. For the reasons explained above, the capacitance value of speed-up capacitor C113 is selected depending on the capacitive load CL.

Further, if speed-up capacitor C113 is variable depending on the capacitive load CL, then the capacitance value may be neglected or set to a small value when the capacitive load is small, or set to a large value when it is large. Speed-up capacitor C113 may also be set variably by providing a plurality of capacitors within the device and then connecting them with conductive wiring.

Figure 10:
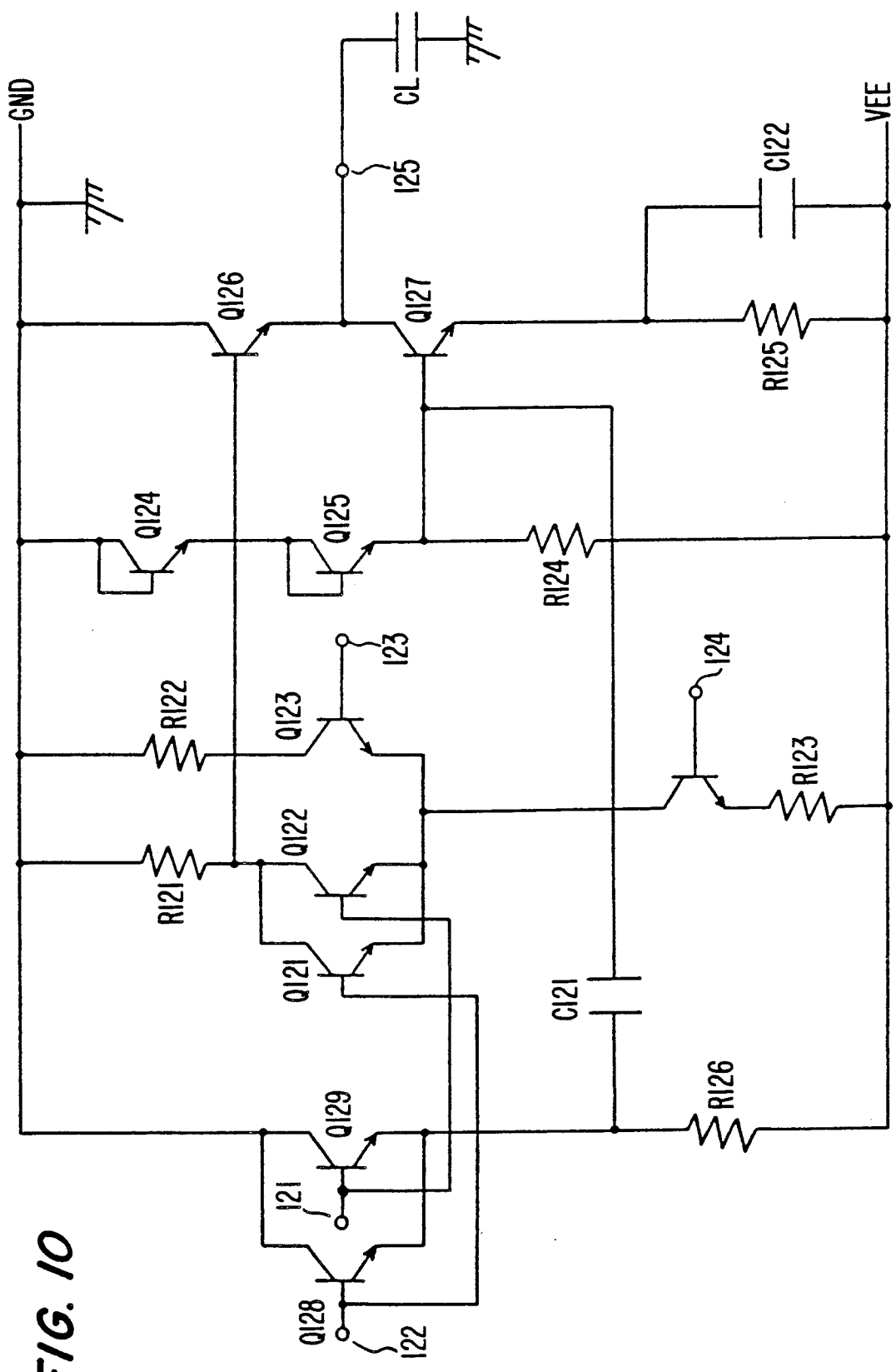
FIG. 10 is a schematic diagram of an embodiment for explaining a plurality of inputs of the present invention.

FIG. 10 is a schematic diagram illustrating a fifth embodiment of the present invention. In FIG. 10, C121, C122 are capacitors, Q122 to Q129 are transistors, and R121 to R126 are resistors. Terminals 121, 122 are input terminals, terminal 123 is a reference voltage terminal, terminal 124 is a constant voltage terminal, and terminal 125 is an output terminal. The NOR phase output is illustrated as the active pull-down output formed by a 2-input circuit. The collector and emitter of transistor Q121 are connected in common with the collector and emitter of transistor Q122 in the input side of the ECL circuit. The base of transistor Q121 is connected to input terminal 122 and the base of transistor Q128. Moreover, the base of transistor Q122 is connected to input terminal 121 and the base of transistor Q129. The bases of transistors Q128 and Q129 of input circuit are connected to the respective input terminals 122, 121, while the collectors are connected to GND and emitters are connected to $V_{EE}$ through resistor R126.

When the ECL circuit provides three or more inputs, the input terminals may be similarly increased. When any one of the input signals changes to a high level from a low level, the transistor to which an input signal is applied of transistors Q121, Q122 in the input side of ECL circuit turns ON and a voltage of output terminal 125 changes to a low level from a high level. Simultaneously, the transistor to which the input signal is applied of transistors Q128, Q129 turns ON. This generates a pulse which turns ON pull-down transistor Q127 with a circuit formed by capacitor C121 and resistor R124 as done in the earlier described embodiments.

Figure 11:
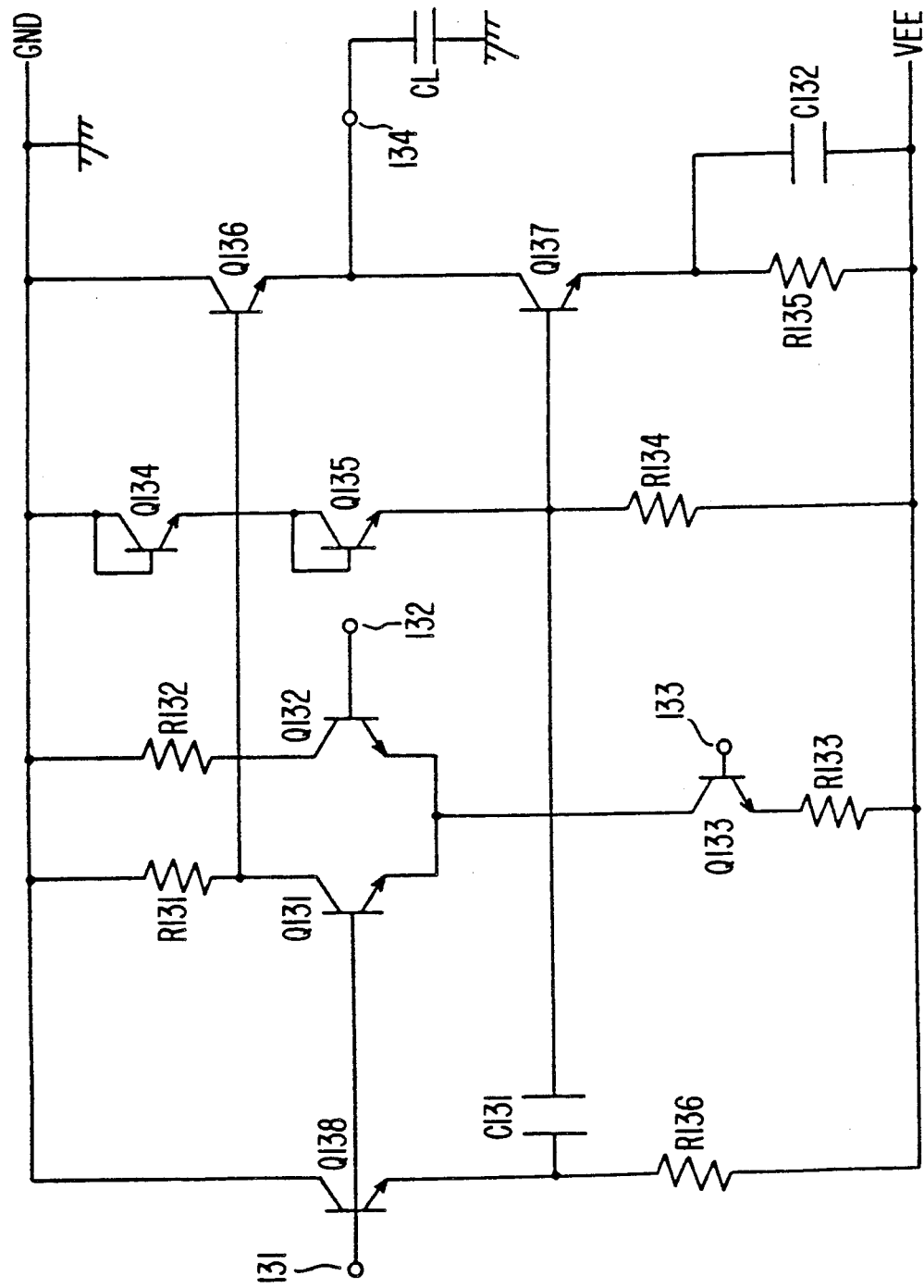
FIG. 11 is a schematic diagram of an embodiment of the present invention where a collector of an input circuit transistor is connected to GND.

FIG. 11 is a schematic diagram illustrating only the NOR phase output as the output of ECL circuit. In FIG. 11, C131, C132 are capacitors, Q131 to Q138 are transistors, and R131 to R136 are resistors. Terminal 131 is an input terminal, terminal 132 is a reference voltage terminal, terminal 133 is a constant voltage terminal, and terminal 134 is an output terminal. With the NOR phase output, it is only required to extract the pulse of the same phase; therefore, the resistor can be removed and the collector of transistor Q138 can be connected directly to ground GND. Since the collector may be connected directly to GND in the device structure to form transistor Q138, the isolation region to isolate transistor Q138 and the peripheral elements is unnecessary. Accordingly, a small area consumption may be realized and integration density can be increased.

Figure 12:
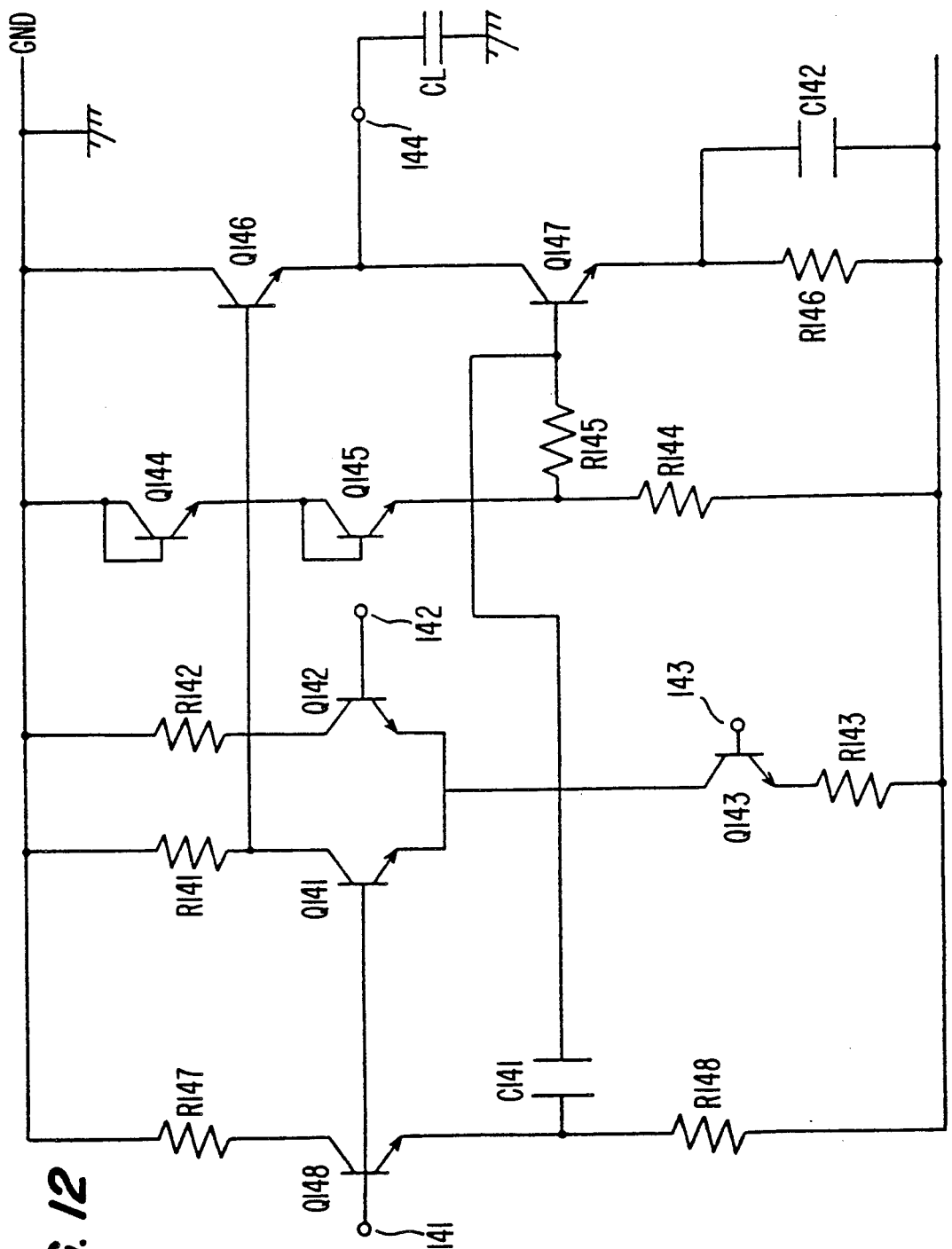
FIG. 12 is a schematic diagram of an embodiment of the present invention where a resistor is inserted to a base of a pull-down transistor.

FIG. 12 is a schematic diagram of a seventh embodiment of the present invention where the NOR phase output is illustrated. In FIG. 12, C141, C142 are capacitors, Q141 to Q148 are transistors, and R141 to R148 are resistors. Terminals 141 to 144 have the same function as terminals discussed above in earlier embodiments. A DC voltage is supplied to the base of pull-down transistor Q147 through resistor R145. When the base of transistor Q147 is discharged, it is discharged through resistor R145. Thus, it takes a longer time for the base of transistor Q147 to discharge. As a result, because transistor Q147 stays in the ON state for a longer period of time, discharge of the capacitive load CL is more effective.

When the resistance value of resistor R144 becomes large, it seems unnecessary to provide resistor R145 like the present invention. However, in the case of both OR/NOR phase outputs to obtain not only the OR output but also the NOR output, it is possible to form the circuit to supply the bias voltage to both pull-down transistors for the common usage (Q144, Q145, resistor R144 in the case of FIG. 12). Hence, if it is attempted to provide resistor R145 as used in this embodiment, it is provided additionally as shown in FIG. 12 because this portion cannot be used in common.

Figure 13:
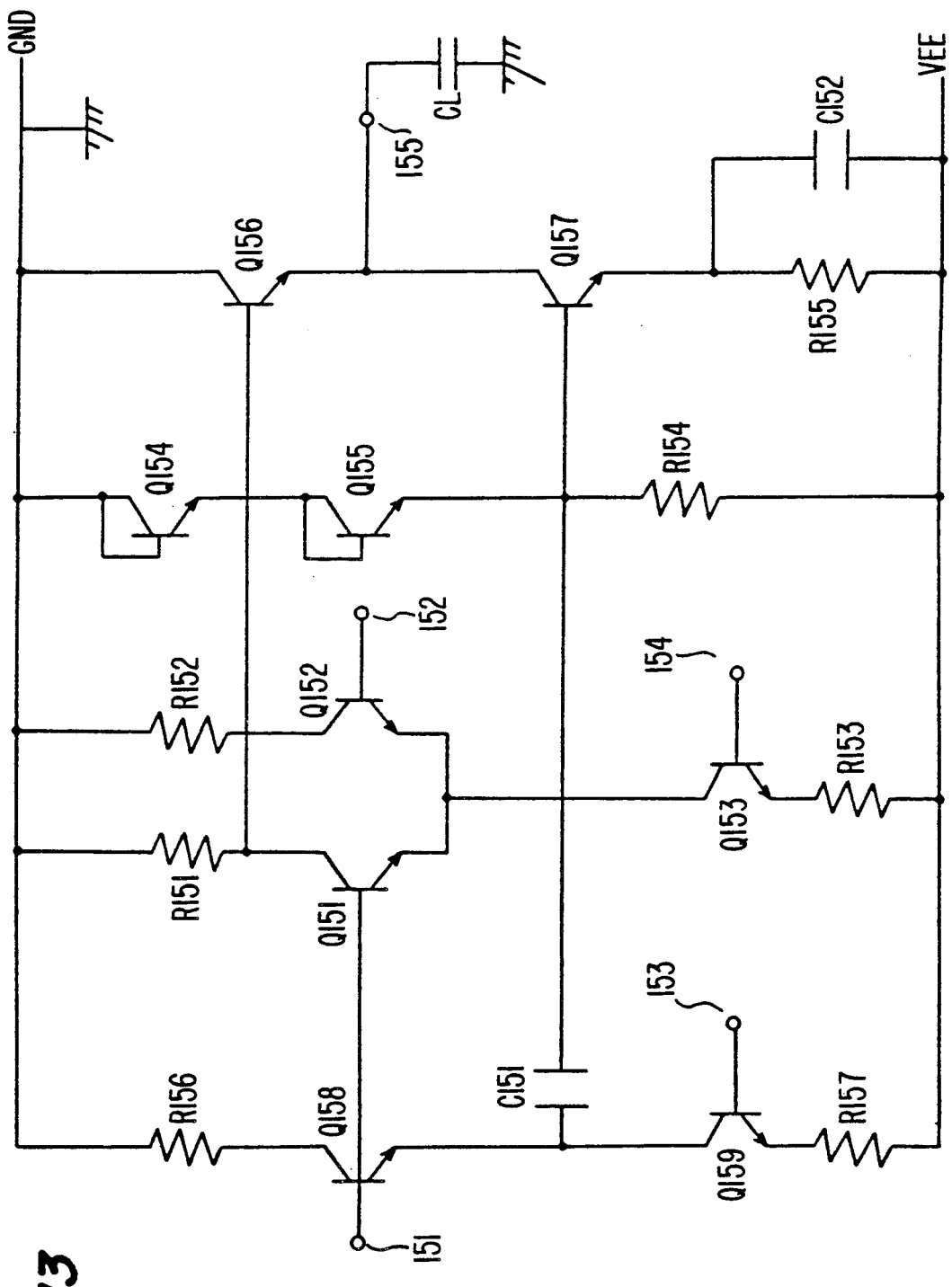
FIG. 13 is a schematic diagram of an embodiment of the present invention where a resistor on the emitter side of an input circuit transistor is replaced with a constant current source.

FIG. 13 is a schematic diagram of an eighth embodiment of the present invention. In FIG. 13, C151, C152 are capacitors, Q151 to Q158 are transistors, and R151 to R157 are resistors. Terminal 151 is an input terminal, terminal 152 is a reference Voltage terminal, terminal 153 is a first voltage terminal, terminal 154 is a second voltage terminal, and terminal 155 is an output terminal. The emitter side of transistor Q158 of the pulse extracting circuit is provided with a constant current source consisting of transistor Q159 and resistor R157 which replaces the resistor used in earlier embodiments. A voltage which turns ON transistor Q159 is applied to terminal 153. The first voltage applied to terminal 153 may be the same as the second voltage applied to terminal 154.

Since the transistor Q159 is used as the constant current source, a current to be applied to the resistor R157 is kept at a constant value. As a result, the voltage to be applied to the capacitor C151 may be stabilized for fluctuation in the source voltage and the amplitude of the pulse generated may be kept constant. The ECL circuit of this embodiment is effective only for the NOR phase output.

Figure 14:
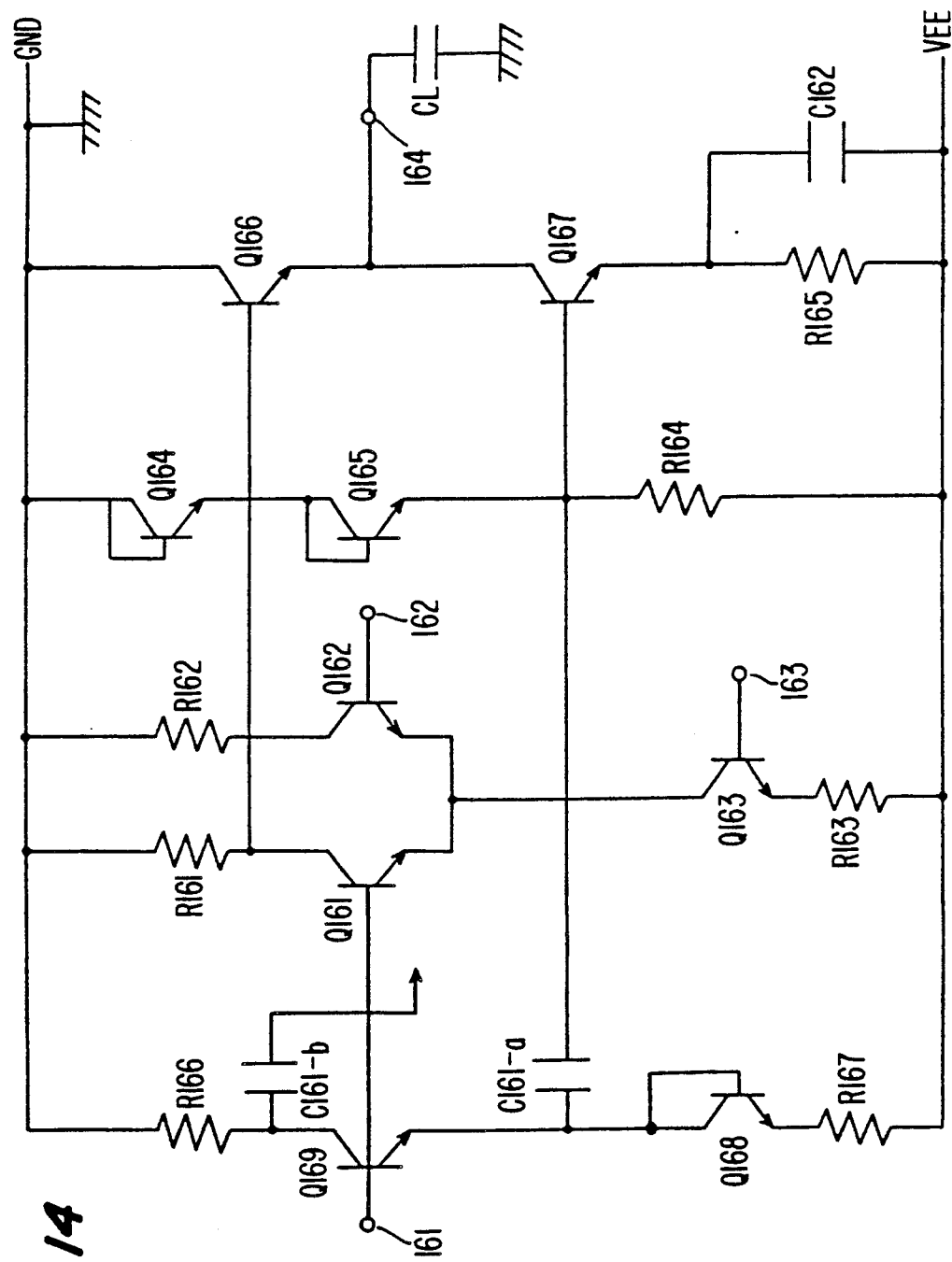
FIG. 14 is a schematic diagram of an embodiment of the present invention where a resistor on the emitter side of an input circuit transistor is connected by the forward PN junction method.

FIG. 14 is a schematic diagram of a ninth embodiment of the present invention. In FIG. 14, C161-a, C161-b and C162 are capacitors, Q161 to Q169 are transistors, and R161 to R167 are resistors. Terminals 161 to 164 have the same function as terminals discussed above in earlier embodiments. The emitter side of transistor Q169 of the pulse extracting circuit is formed by the transistor Q168 and the resistor R167 which replaces the resistor which is used by itself in earlier embodiments. Transistor Q168 is used as the PN junction by connecting the collector and base. Transistor Q168 may also be replaced with an ordinary PN junction diode.

This embodiment is used for matching between the values of resistors R166, R167 and the source voltage $V_{EE}$ so that the amplitudes become equal when the pulse is generated by either capacitor C161-a or capacitor C161-b. As a result, for both NOR/OR phase outputs, the amplitudes of pulses generated from the capacitors C161-a and C161-b become equal through a constant voltage drop by transistor Q168.

Figure 15:
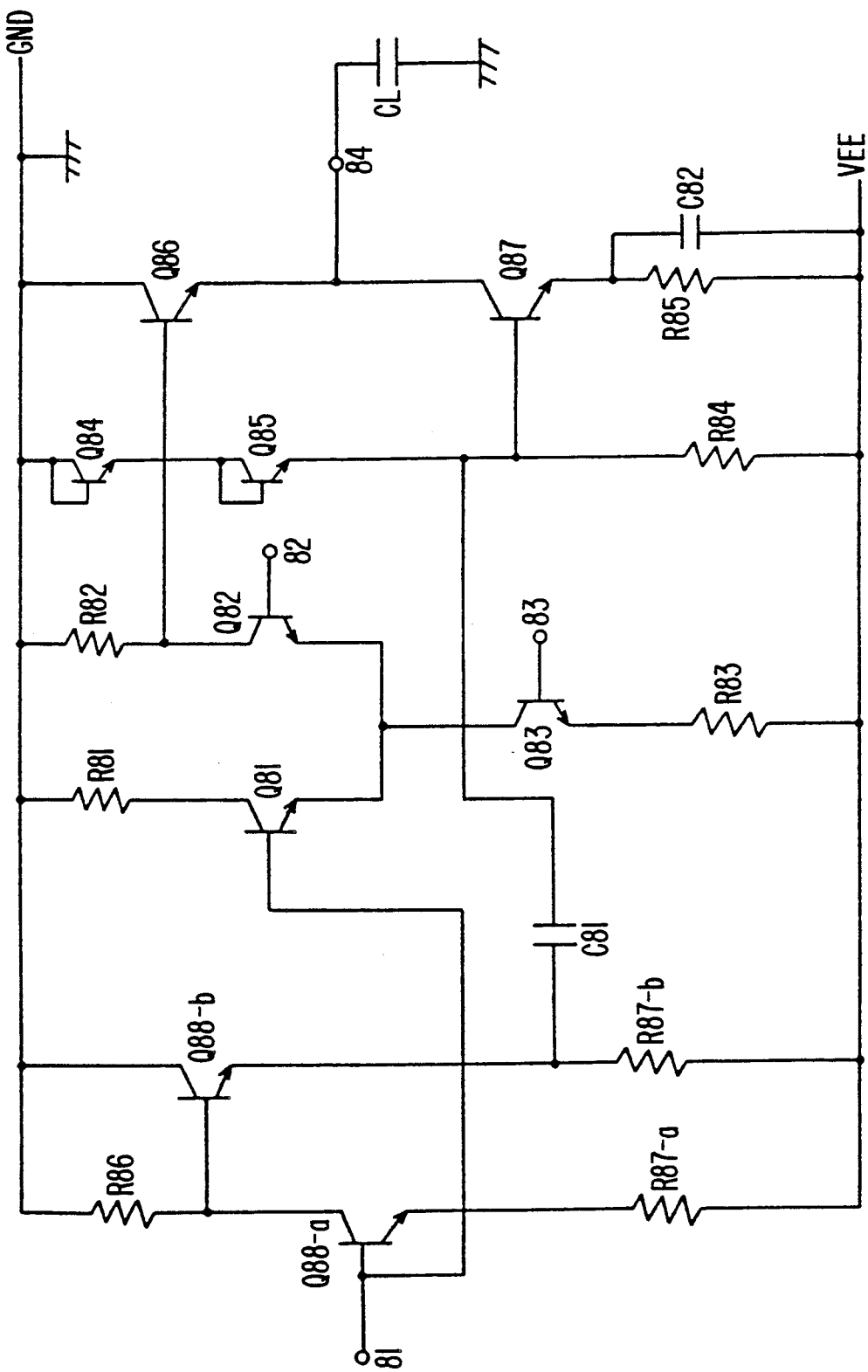
FIG. 15 is a schematic diagram of an embodiment of the present invention where another input circuit is added for the purpose of pulse shaping.

FIG. 15 is a schematic diagram of a tenth embodiment of the present invention. The elements like those in FIG. 7 are denoted by like reference numerals. An additional stage is added having emitter follower transistor Q88-b and resistor R87-b which are added to the R86, Q88-a and R87-a corresponding to the input circuit shown in FIG. 7. Thus, a voltage change of the input signal applied to transistor Q88-a of the input circuit in the first stage may be further enlarged by transistor Q88-b of the input circuit in the second stage. The pull-down transistor Q87 can then be turned ON accurately.

Figure 16:
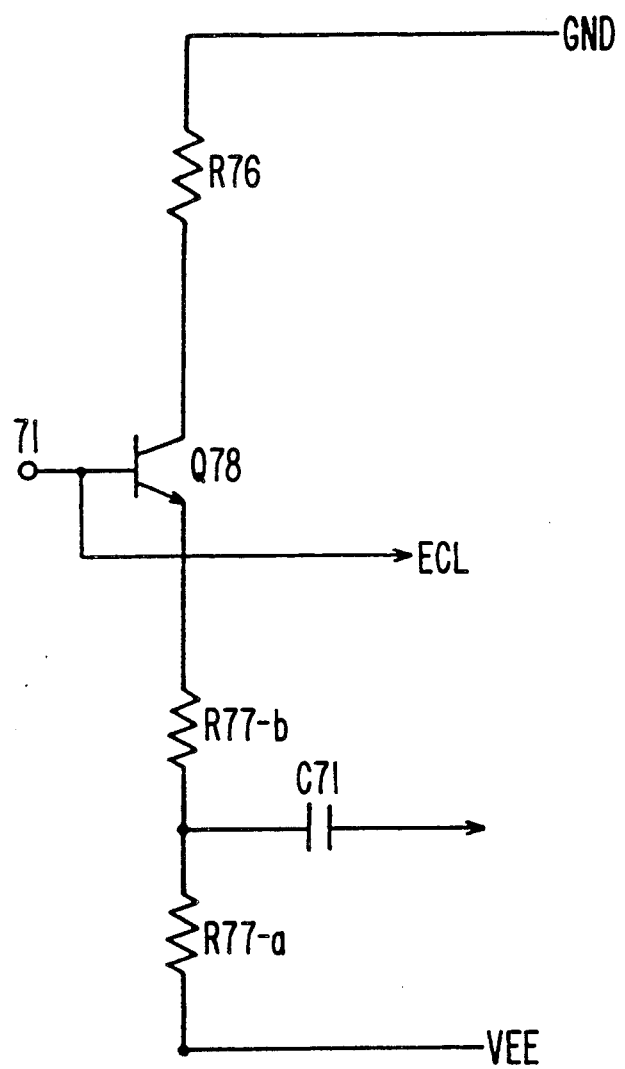
FIG. 16 is a schematic diagram of an embodiment where undershoot is suppressed by changing the peak of a pulse.

FIG. 16 is a schematic diagram of an eleventh embodiment of the present invention. The elements like those in FIG. 6 are denoted by like reference numerals. Resistor R76, transistor Q78 and resistor R77-a correspond to the input circuit shown in FIG. 6. Resistor R77-b is added between the emitter of transistor Q78 and resistor R77-a, and capacitor C71 is connected between resistors R77-b and R77-a. The pulse peak may be suppressed by resistor R77-b in order to restrict undershoot.

When a pulse for driving pull-down transistor is generated from the capacitor C71 is too large, amplitude of undershoot becomes high. This produces the undesirable ringing effect. Namely, when the voltage of the output terminal drops to a low level from a high level, the level temporarily drops below the ordinary low level. Thereafter, the level rises above the ordinary low level. This level exceeds the threshold voltage ($V_{ref}$) of the transistor in the input side of ECL circuit in the next stage (not shown) resulting in malfunction of the device.

In order to prevent such ringing, one approach is to make the amplitude of pulse to be applied to the pull-down transistor small. Hence, the amplitude of undershoot becomes small and malfunction can be prevented. For this purpose, the amplitude of pulse generated can be reduced by adding a resistor R77-b between the emitter of transistor Q78 and resistor R77-a.

Figure 18:
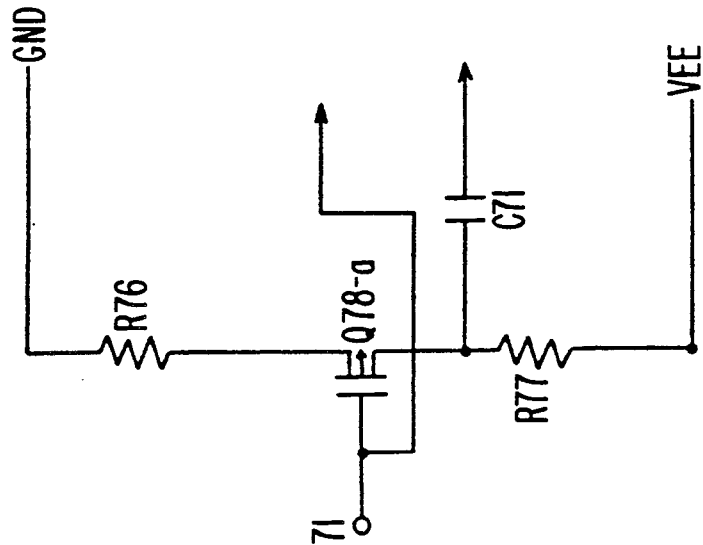
FIG. 18 is a schematic diagram of an embodiment where a MOSFET is used for an input circuit transistor.
Figure 17:
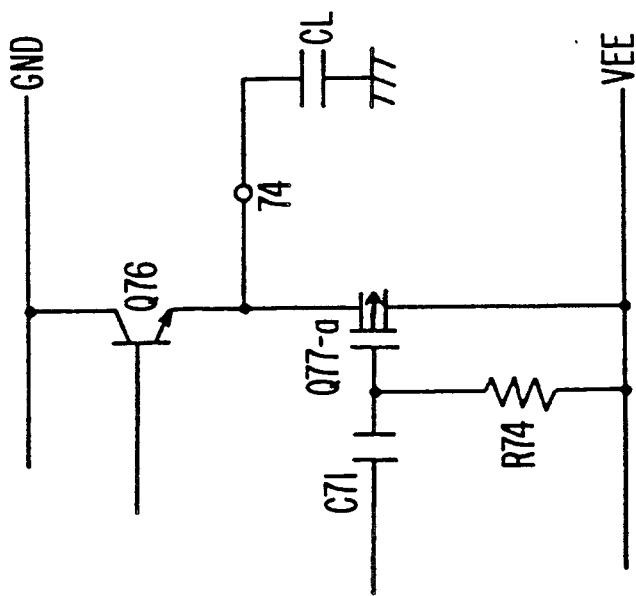
FIG. 17 is a schematic diagram of an embodiment where a MOSFET is used for a pull-down transistor.

FIGS. 17 and 18 are schematic diagrams of the twelfth and thirteenth embodiments of the present invention, respectively. The elements like those in FIG. 6 are denoted by like reference numerals. Pull-down transistor Q77 formed by a bipolar transistor as shown in FIG. 6 can also be formed by a MOSFET Q77-a as illustrated in FIG. 17. In this case, resistor R75 and resultant speed-up capacitor C72 which have been required for the bipolar transistor are no longer necessary. Moreover, in FIG. 18, the bipolar transistor Q78 in the input circuit may be replaced with MOSFET Q78-a.

A fourteenth embodiment of the present invention is discussed in relation to FIG. 6. In FIG. 6, it is also possible to eliminate transistors Q74, Q75, which supply a DC bias to pull-down transistor Q77, and to drive pull-down transistor Q77 without using a DC bias. Hence, the area consumption on the device can be reduced as much as the region used by transistors Q74, Q75. However, when a DC bias is not supplied, the operation speed of pull-down transistor Q77 becomes slow. Accordingly, it is desirable to employ this embodiment when it is considered more important to reduce the area used on the device rather than to improve the operation speed.

Figure 19:
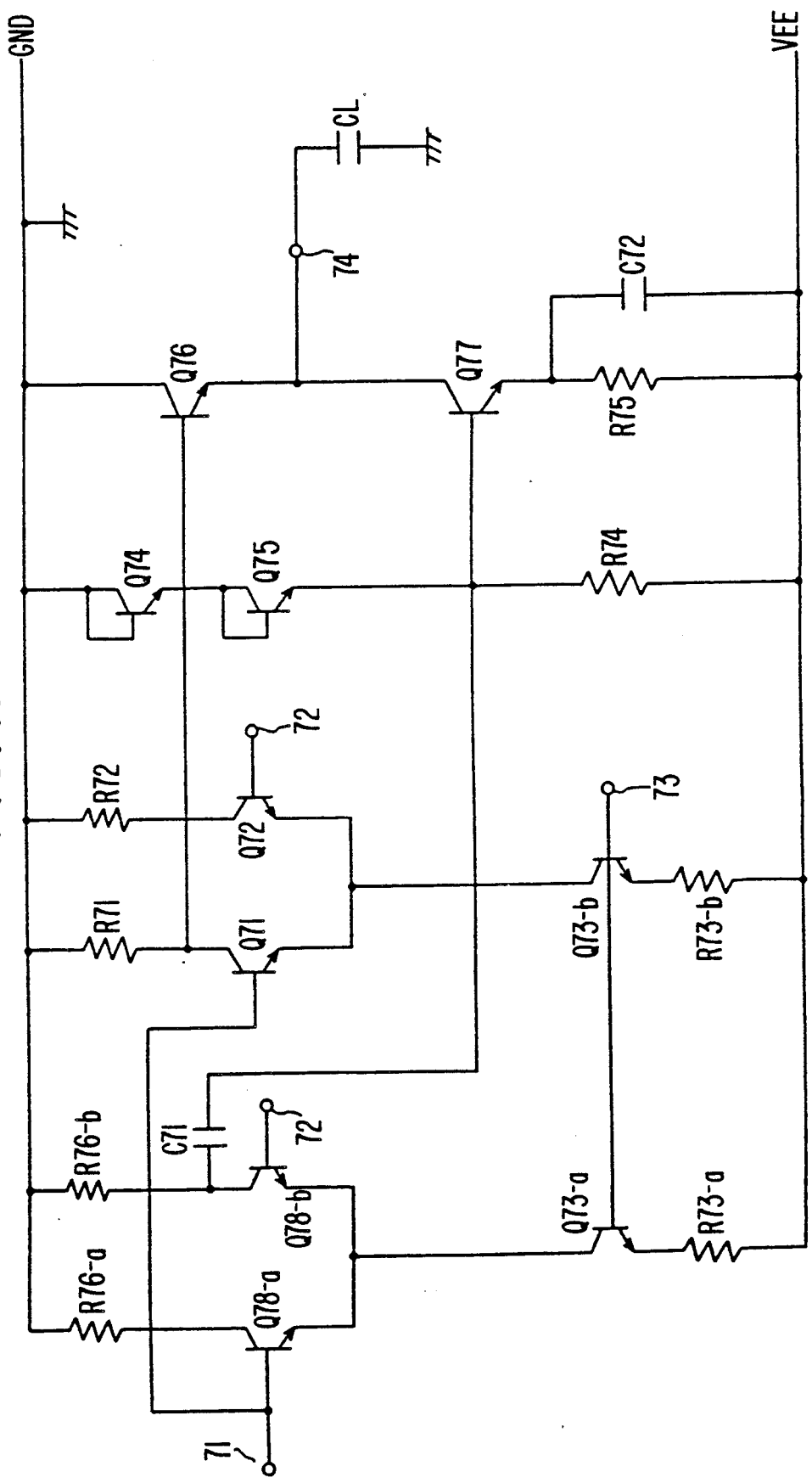
FIG. 19 is a schematic diagram of an embodiment of NOR phase output in an input circuit used as the ECL circuit.

FIG. 19 is a schematic diagram illustrating a fifteenth embodiment of the present invention. The elements like those in FIG. 6 are denoted by like reference numerals. Like FIG. 6, only the NOR phase output is illustrated.

In FIG. 19, the input circuit shown in FIG. 6 has the same structure as the current switch circuit consisting of transistors Q71, Q72 and the current switch circuit (ECL circuit) is formed by transistors Q78-a, Q78-b and resistors R76-a, R76-b. A constant current source of the ECL circuit in the input circuit side is formed by transistor Q73-a and resistor R73-a, while the constant current source of ECL circuit formed by transistors Q71, Q72 is composed of transistor Q73-b and resistor R73-b.

Moreover, in FIG. 19, the input signal is input to the base of transistor Q78-a of the input circuit through the input terminal 71 and is also input to the base of transistor Q71 of another ECL circuit. These ECL circuits operate as ordinary ECL circuits. When the input signal to input terminal 71 changes a high level from a low level and exceeds the threshold voltage ($V_{ref}$) at terminal 72 of the ECL circuit of the input circuit, the collector voltage of transistor Q78-b also changes to a high level from a low level and a positive pulse is generated by the differential circuit formed by the capacitor C71 and resistor R74. The operations are the same as those of the circuit shown in FIG. 6.

Figure 20:
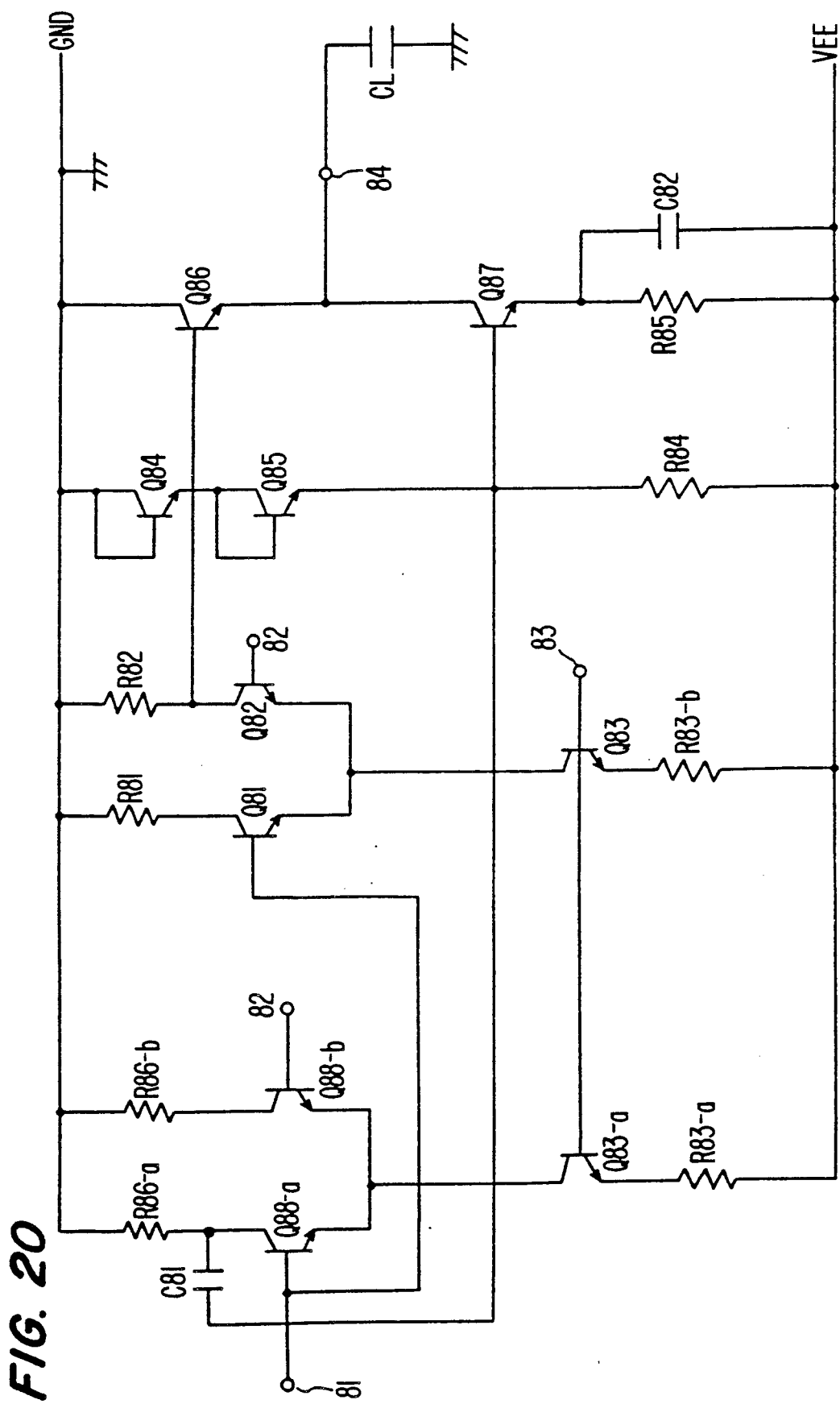
FIG. 20 is a schematic diagram of an embodiment of OR phase output in an input circuit used as the ECL circuit.
Figure 21:
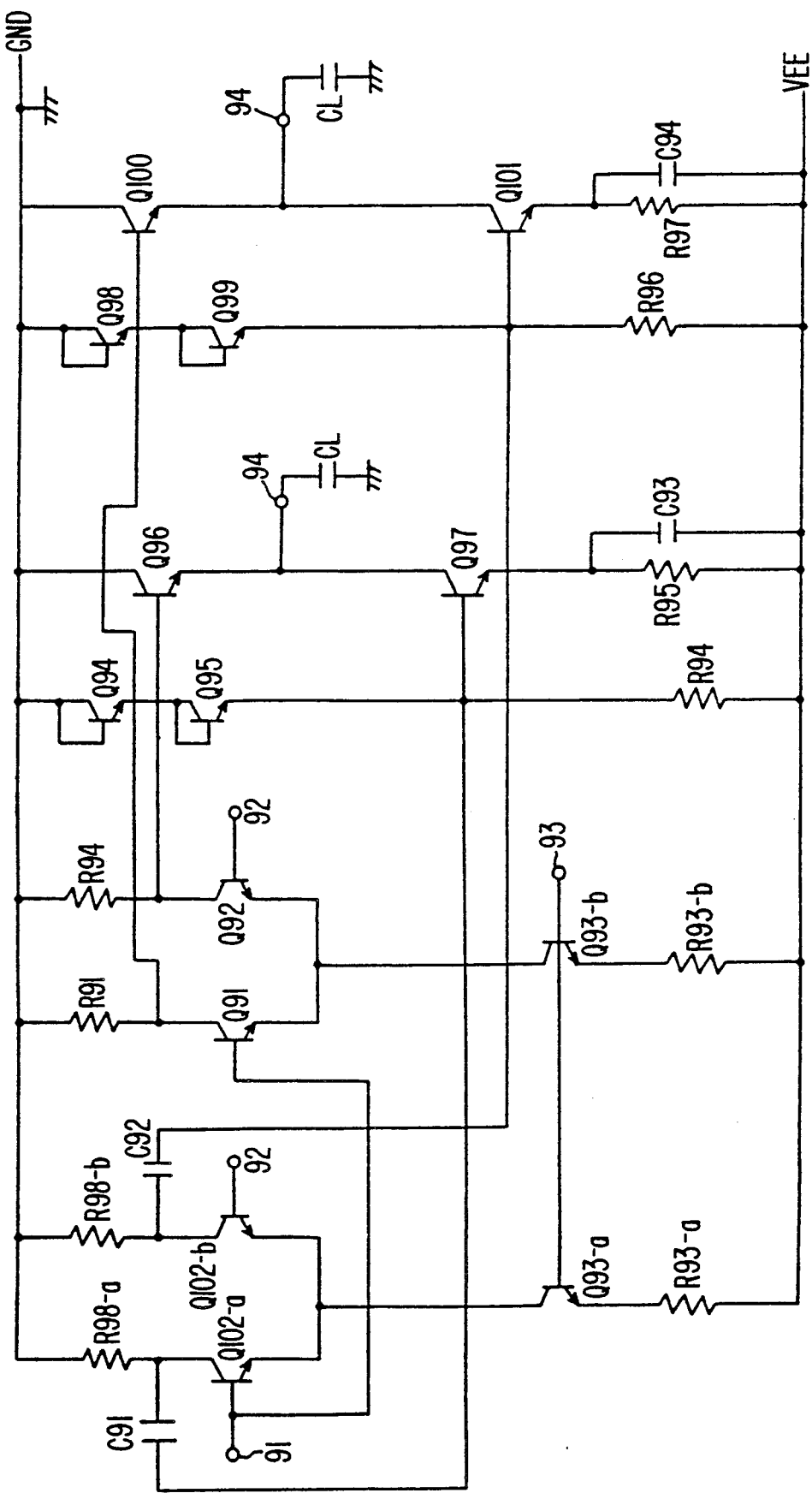
FIG. 21 is a schematic diagram of an embodiment of OR/NOR phase outputs in an input circuit used as the ECL circuit.

FIG. 20 illustrates a circuit similar to the circuit illustrated in FIG. 7. Namely, the input circuit is formed only for the OR phase output and the ECL circuit consists of transistors Q88-a and Q88-b. Likewise, FIG. 21 illustrates a circuit similar to the circuit illustrated in FIG. 8. That is, the input circuit is formed for both OR and NOR phase outputs and the ECL circuit consists of the transistors Q102-a, Q102-b. The elements like those in FIGS. 7 and 8 are denoted by like reference numerals in FIGS. 20 and 21, respectively.

In this embodiment, the same data may be used effectively for a designing job using CAD, etc., by forming the input circuit like the ordinary ECL circuit consisting of transistors Q71, Q72. Moreover, this embodiment can also be used effectively in common for the mask pattern, etc. in the manufacturing process.

Figure 22:
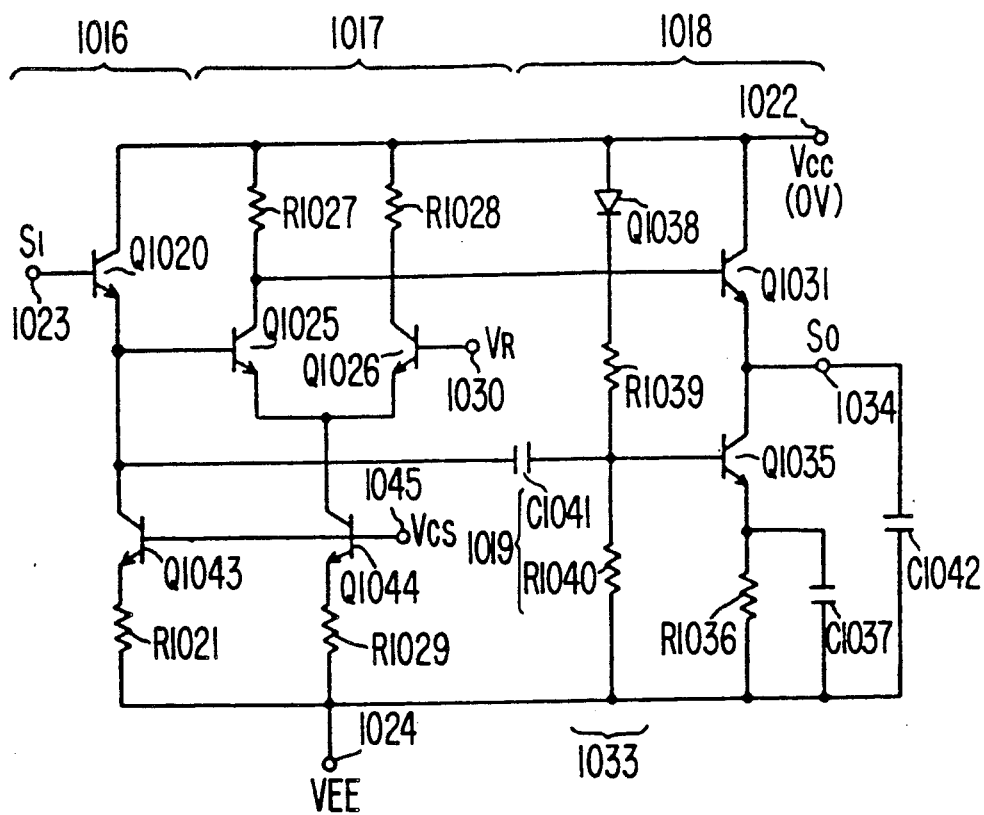
FIGS. 22–24 are schematic diagrams illustrating other embodiments of the present invention.
Figure 23:
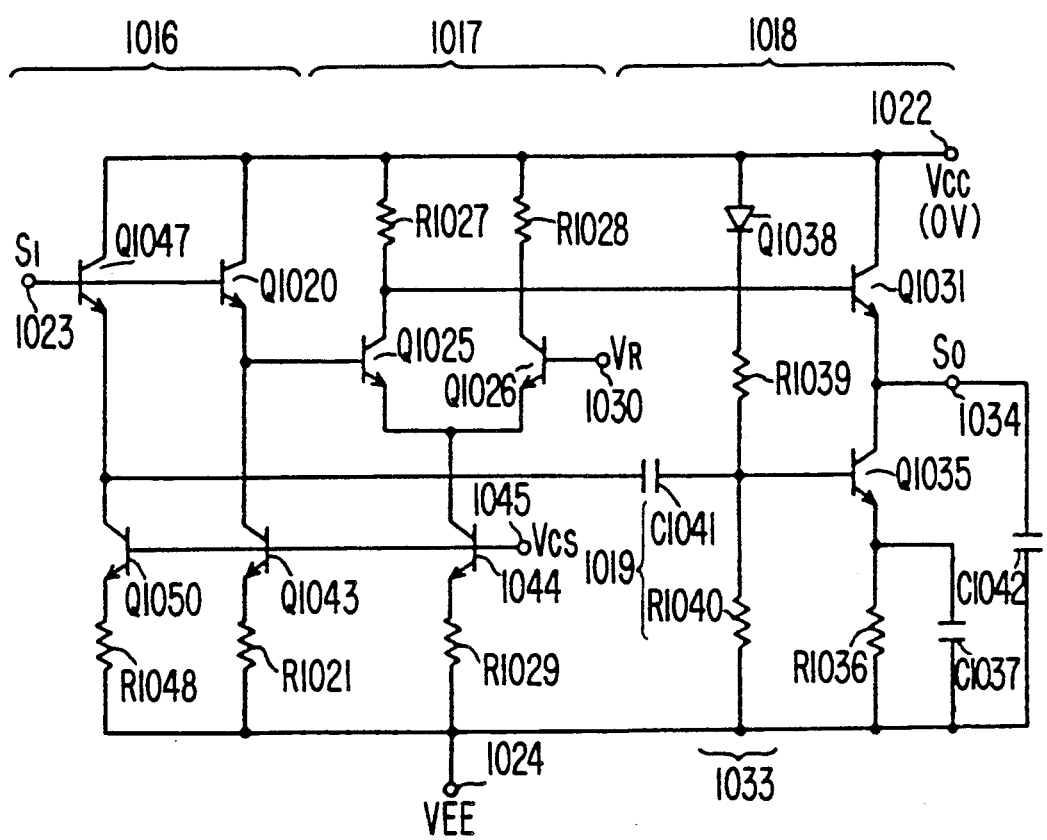
Figure 24:
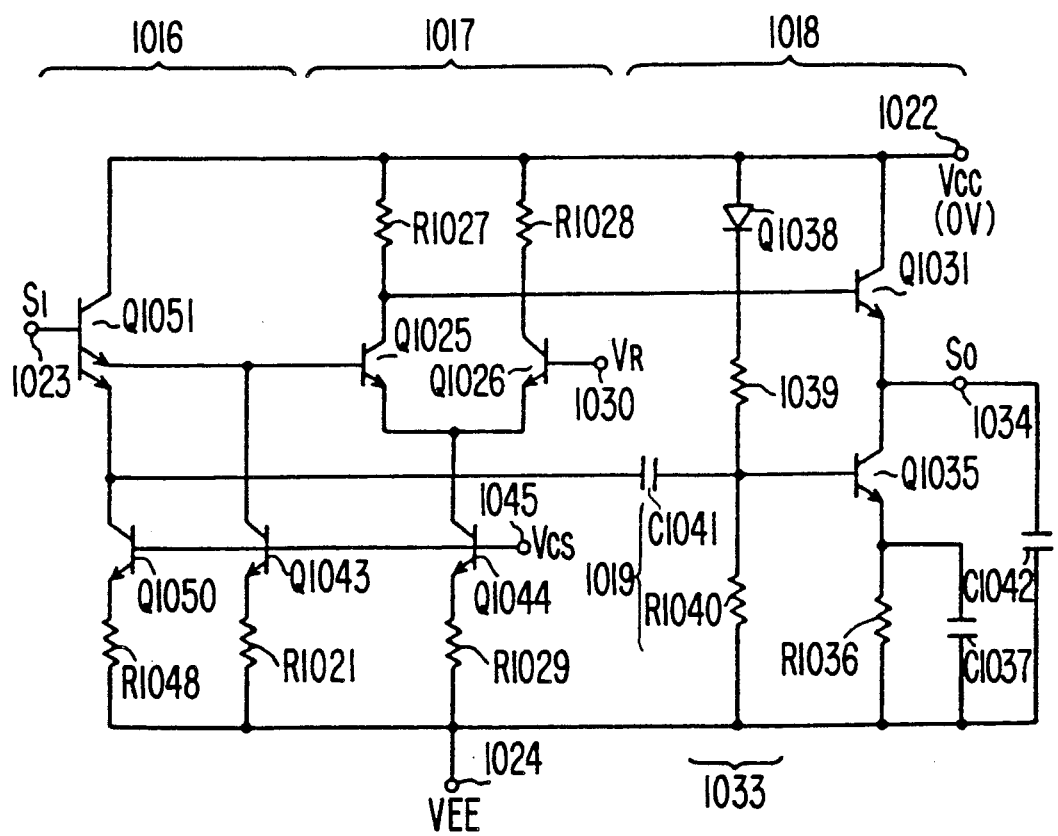

FIGS. 22 to 24 are schematic diagrams of other embodiments of the present invention. In FIGS. 22 to 24, C1037, C1041 and C1042 are capacitors, Q1020, Q1025, Q1026, Q1031, Q1035, Q1043 and Q1044 are transistors, R1021, R1027, R1028, R1029, R1036, R1039 and R1040, and Q1038 is a diode. Terminals 1023, 1030, 1034 and 1045 have the same function as terminals discussed above in earlier embodiments. In FIG. 22, the input circuit 1016 is formed by the emitter follower circuit providing the NPN transistor Q1020 and resistor R1021. The collector of NPN transistor Q1020 is connected to a high voltage power source 1022, the base is connected to the input terminal 1023, and the emitter is connected to a low voltage power source 1024 through a resistor R1021.

The collector of NPN transistor Q1043 is connected to the emitter of NPN transistor Q1020, while the base is connected to the current source voltage input terminal 1045 to which a current source voltage ($V_{cs}$) is input, and the emitter is connected to the low voltage power source voltage 1024 through resistor R1021. Moreover, the collector of NPN transistor 1044 is connected to the emitters of NPN transistors Q1025, Q1026, while the base is connected to the current source voltage input 1045, and the emitter is connected to the low voltage power source 1024 through resistor R1029.

FIG. 22 illustrates a schematic diagram of the circuit for NOR phase output. An input signal is input to the base of transistor Q1020 of the input circuit through the input terminal 1023. This signal is amplified by the transistor Q1020 for enhancing a driving force which is input to both the base of transistor Q1025 of current switch circuit and the circuit consisting of capacitor C1041 and resistor R1040.

The successive operations of FIG. 22 are similar to that of the circuit shown in FIG. 6. The input circuit 1016 of this embodiment is formed as the constant current circuit consisting of transistors Q1020, Q1043 and resistor R1021. Thus, an input load can be alleviated, the preceding stage may be formed by the current mode logic (CML) circuit not using the emitter follower circuit and operation speed can be improved.

FIG. 23 illustrates a schematic diagram of the circuit for OR phase output. In FIG. 23, Q1047, Q1050 are transistors and R1048 is a resistor. The operation of this circuit is similar to the operation of the circuit of NOR phase output illustrated in FIG. 22.

FIG. 24 is a schematic diagram illustrating a circuit for NOR phase output using a multi-emitter transistor Q1051 in the input circuit.

As explained above, the present invention is capable of (i) forming an ECL circuit which ensures high speed switching from a low level to a high level and from a high level to a low level even when the capacitive load is large; (ii) forming a high-speed ECL circuit which uses both OR/NOR phases; and (iii) realizing high speed operation, low power dissipation and increased integration density in an integrated circuit. The present invention provides distinctive effects when applied to high speed and high integration density emitter coupled logic LSI.

The foregoing is considered as illustrative only of the principles of the invention. That is, the many features and advantage of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and application shown and described, and accordingly, all suitable modifications and equivalents may be resorted to, falling within the scope of the invention.

What is claimed is:

1. An emitter coupled logic circuit, operatively connectable to first and second power sources, and having an input terminal receiving an input signal and an output terminal having a capacitive load, said emitter coupled logic circuit comprising:
   input means, operatively connected to the input terminal, for producing a discharge pulse based on the input signal;
   current switch means operatively connected to the input terminal, independent of said input means, for producing a switching current;
   differential means for receiving the discharge pulse and outputting a differential pulse based on the discharge pulse; and
   output means for receiving the discharge pulse, for producing an output at the output terminal, and for discharging the capacitive load of the output terminal based on the different pulse when the output at the output terminal is to transition from a high logic level to a low logic level.

2. An emitter coupled logic circuit as recited in claim 1, wherein said emitter coupled logic circuit is formed on a large scale integrated circuit having a high integration density, and
wherein said input means and said current switch means concurrently receive the input signal.

3. An emitter coupled logic circuit as recited in claim 1, wherein said input means comprises:
an input resistor operatively connected to the second power source; and
an input transistor, operatively connected to said differential means, having base, emitter and collector terminals, the base terminal is operatively connected to the input terminal, the emitter terminal is operatively connected to said input resistor, and the collector terminal is operatively connected to the first power source.

4. An emitter coupled logic circuit as recited in claim 3, wherein said differential means comprises a capacitor having first and second sides, the first side is connected to one of the emitter and the collector of said input transistor, and the second side is connected to said output means.

5. An emitter coupled logic circuit as recited in claim 4,
wherein said output means comprises an emitter follower transistor and a pull-down transistor, a discharge path existing between a base of said pull-down transistor and the second power source, and
wherein said circuit further comprises biasing means for DC biasing said pull-down transistor.

6. An emitter coupled logic circuit as recited in claim 4, wherein the capacitive load has a capacitive value, and
wherein said circuit further comprises a speed-up capacitor, operatively connected in parallel with said input resistor, having a capacitance value selected based on the capacitance value of the capacitive load.

7. An emitter coupled logic circuit as recited in claim 5, wherein said emitter coupled logic circuit further comprises a base resistor having first and second sides, the first side is connected to said biasing means and the second side is operatively connected to the base of said pull-down transistor.

8. An emitter coupled logic circuit as recited in claim 3, wherein said input means further comprises current source means operatively connected between said input resistor and the emitter of said input transistor.

9. An emitter coupled logic circuit as recited in claim 3, wherein said input means further comprises PN junction means operatively connected between said input resistor and the emitter of said input transistor.

10. An emitter coupled logic circuit as recited in claim 1, wherein said input means comprises:
first and second input resistors operatively connected to the second power source;
a first input transistor having base, emitter and collector terminals, the base terminal is operatively connected to the input terminal, the emitter terminal is operatively connected to said first input resistor, and the collector terminal is operatively connected to the first power source; and
a second input transistor, operatively connected to said differential means, having base, emitter and collector terminals, the base terminal is operatively connected to the collector terminal of said first input transistor, the emitter terminal is operatively connected to said second input resistor, and the collector terminal is operatively connected to the first power source.

11. An emitter coupled logic circuit as recited in claim 1, wherein said circuit has a plurality of input terminals including first and second input terminals, and
wherein said input means comprises:
an input resistor operatively connected to the second power source;
a first input transistor, operatively connected to said differential means, having base, emitter and collector terminals, the base terminal is operatively connected to the first input terminal, the emitter terminal is operatively connected to said input resistor, and the collector terminal is operatively connected to the first power source; and
a second input transistor, having base, emitter and collector terminals, the base terminal is operatively connected to the second input terminal, the emitter terminal is operatively connected to said input resistor, and the collector terminal is operatively connected to the first power source.

12. An emitter coupled logic circuit as recited in claim 1, wherein said input means comprises:
a first input resistor operatively connected to the second power source;
a second input resistor having a first side connected to said first input resistor, and a second side operatively connected to said differential means; and
an input transistor having base, emitter and collector terminals, the base terminal is operatively connected to the input terminal, the emitter terminal is operatively connected to the second side of said second input resistor, and the collector terminal is operatively connected to the first power source.

13. An emitter coupled logic circuit as recited in claim 1, wherein said input means comprises:
an input resistor operatively connected to the second power source; and
an input field effect transistor, operatively connected to said differential means, having gate, drain and source terminals, the gate terminal is operatively connected to the input terminal, the drain terminal is operatively connected to said input resistor, and the source terminal is operatively connected to the first power source.

14. An emitter coupled logic circuit as recited in claim 13, wherein said differential means comprises a capacitor having first and second sides, the first side is connected to at least one of the drain and the source of said input field effect transistor, and the second side is connected to said output means.

15. An emitter coupled logic circuit as recited in claim 14,
wherein said differential means further comprises a differential resistor having a first side connected to the second power source, and a second side operatively connected to the second side of said capacitor at a connection point, and
wherein said output means comprises a field effect transistor having gate, drain and source terminals, the gate terminal is operatively connected to the connection point, the drain is operatively connected to the second power source, and the source is operatively connected to the output terminal.

16. An emitter coupled logic circuit as recited in claim 1, wherein said input means comprises:
   an input resistor operatively coupled to the second power source; and
   an input transistor, operatively connected to said differential means, having base, emitter and collector terminals, the base terminal is operatively connected to the input terminal, the emitter terminal is operatively connected to said input resistor and said current switch means, and the collector terminal is operatively connected to the first power source, and
   wherein said current switch means is operatively connected to the input terminal via said input transistor.

17. An active pull-down emitter coupled logic circuit, operatively connectable to first and second power sources, and having an input terminal and an output terminal, said active pull-down emitter coupled logic circuit comprising:
   current switch means for producing a switching current;
   a capacitor having first and second sides;
   an emitter follower transistor having base, emitter and collector terminals, the base terminal is operatively connected to said current switch means for receiving the switching current, the emitter is operatively connected to the output terminal, and the collector is operatively connected to the first power source;
   a pull-down resistor operatively connected to the second power source;
   a pull-down transistor having base, emitter and collector terminals, the base terminal is operatively connected to the second side of said capacitor, the emitter terminal is operatively connected to said pull-down resistor, and the collector terminal is operatively connected to the output terminal;
   a first input resistor operatively connected to the second power source; and
   an input transistor, operatively connected to the first side of said capacitor, having base, emitter and collector terminals, the base terminal is operatively connected to the input terminal, the emitter terminal is operatively connected to said first input resistor, and the collector terminal is operatively connected to the first power source, said input transistor being independent of said current switch means.

18. An active pull-down emitter coupled logic circuit as recited in claim 17, wherein the first side of said capacitor is connected to one of the emitter and the collector of said input transistor.

19. An active pull-down emitter coupled logic circuit as recited in claim 17,
   further
   comprising a second input resistor operatively connected between the first power source and the collector terminal of said input transistor, and
   wherein the first side of said capacitor is connected to the collector terminal of said input transistor.

20. An active pull-down emitter coupled logic circuit as recited in claim 17,
   further comprising biasing means for biasing said pull-down transistor.

21. An active pull-down emitter coupled logic circuit as recited in claim 17, wherein the output terminal is connected to a capacitive load having a capacitance value, and
   wherein said active pull-down emitter coupled logic circuit further comprises a speed-up capacitor, operatively connected in parallel with said first input resistor, having a capacitance value selected based on the capacitance value of the capacitive load.

22. An emitter coupled logic circuit, operatively connectable to first and second power sources, and having an input terminal and first and second output terminal, said emitter coupled logic circuit comprising:
   current switch means for producing first and second switching currents;
   a first capacitor having first and second sides;
   a second capacitor having first and second sides;
   a first emitter follower transistor having base, emitter and collector terminals, the base terminal is operatively connected to said current switch means for receiving the first switching current, the emitter is operatively connected to the first output terminal, and the collector is operatively connected to the first power source;
   a second emitter follower transistor having base, emitter and collector terminals, the base terminal is operatively connected to said current switch means for receiving the second switching current, the emitter is operatively connected to the second output terminal, and the collector is operatively connected to the first power source;
   first and second pull-down resistors, each operatively connected to the second power source;
   a first pull-down transistor having base, emitter and collector terminals, the base terminal is operatively connected to the second side of said first capacitor, the emitter terminal is operatively connected to said first pull-down resistor, and the collector terminal is operatively connected to the first output terminal;
   a second pull-down transistor having base, emitter and collector terminals, the base terminal is operatively connected to the second side of said second capacitor, the emitter terminal is operatively connected to said second pull-down resistor, and the collector terminal is operatively connected to the second output terminal;
   a collector resistor operatively connected to the first power source;
   an emitter resistor operatively connected to the second power source; and
   an input transistor having base, emitter and collector terminals, the base terminal is operatively connected to the input terminal, the emitter terminal is operatively connected to said emitter resistor and the first side of said second capacitor, and the collector terminal is operatively connected to the collector resistor and the first side of said first capacitor.

23. An emitter coupled logic circuit having an input terminal and an output terminal, and connectable to first and second power sources, said emitter coupled logic circuit comprising:
   a current switch circuit, operatively connected between the first and second power sources and operatively connected to the input terminal, including at least first and second transistors having emitters connected in common at a connection point, the base of said first transistor is connected to the input terminal, and a current source connected to the connection point;

an emitter follower transistor, connected to the first power source, the base is connected to at least one collector of said first and second transistors, and the emitter of said emitter follower transistor is connected to the output terminal;

a pull-down transistor, operatively connected to the second power source, the collector of said pull-down transistor is connected to the output terminal;

an input circuit including a third transistor and an input impedance means for providing an input impedance, said third transistor and said impedance means for connected in series between the first and second power sources, and the base of said third transistor is connected to the input terminal, an emitter and collector of said third transistor being independent of the emitter and collector of said first and second transistors; and a first capacitor provided between the emitter of said third transistor and the base of said pull-down transistor.

24. An emitter coupled logic circuit as recited in claim 23, wherein a second capacitor is provided across said input impedance means.

25. An emitter coupled logic circuit as recited in claim 24,
wherein the output terminal has a capacitive load connected thereto, and
wherein a plurality of impedance means are provided across said input impedance means and said plurality of impedance means are connected in parallel depending on the capacitive load at the output terminal to vary the values of said first and second capacitors.

26. An emitter coupled logic circuit as recited in claim 14,
wherein said input circuit further includes a second input terminal, and
wherein said emitter coupled logic circuit further comprises
a fourth transistor connecting the collector and emitter in common with the collector and emitter of said first transistor and connecting the base to the second input terminal; and a fifth transistor connecting the collector and emitter in common to the collector and emitter of said third transistor and connecting the base to the second input terminal.

27. An emitter coupled logic circuit as recited in claim 14, further comprising:
level shift means for setting a shift level of said pull-down transistor and a first resistor connected in series at an intermediate point between the first power source and the second power source; and
a second resistor provided between the intermediate point of said level shift means and said first resistor and the base of said pull-down transistor.

28. An emitter coupled logic circuit having an input terminal and an output terminal, and connectable to first and second power sources, said emitter coupled logic circuit comprising:
current switch circuit, operatively connected to the first and second power sources, including at least first and second transistors having emitters connected in common at a first connection point, a base of said first transistor is connected to the input terminal, and a first current source is connected to the first connection point;

an emitter follower transistor, connected to the first power source, a base is connected to at least one collector of said first and second transistors, and an emitter is connected to the output terminal;

a pull-down transistor, operatively connected to the second power source, a collector of said pull-down transistor is connected to the output terminal;

an input circuit, independent of said current switch circuit, including third and fourth transistors having emitters connected in common at a second connection point, and a second current source connected to the emitters connected in common at the second connection point, and a base of the third transistor is connected to the input terminal and the base of said first transistor; and a capacitor provided between the collector of one of said fourth and fifth transistors and the base of said pull-down transistor, the emitters and collectors of said third and fourth transistors being connected independently of the emitters and collectors of said first and second transistors.

* * * * *

UNITED STATES PATENT AND TRADEMARK OFFICE
CERTIFICATE OF CORRECTION

PATENT NO. : 5,118,973

DATED : JUNE 2, 1992

INVENTOR(S) : TOSHIAKI SAKAI ET AL.

It is certified that error appears in the above-identified patent and that said Letters Patent is hereby corrected as shown below:

TITLE PAGE [56] References Cited, before line 3, insert:

```
  --4,539,493   9/1985   Varadarajan         307/455
    4,626,709  12/1986   Manzumder et al.    307/455--.
```

Col. 9, line 35, "Voltage" should be --voltage--.

Col. 17, line 15, "for" should be --are--.

Signed and Sealed this

Seventeenth Day of August, 1993

*Attest:*

BRUCE LEHMAN

*Attesting Officer*   *Commissioner of Patents and Trademarks*